(12) United States Patent
Miyajima

(10) Patent No.: US 6,949,786 B2
(45) Date of Patent: Sep. 27, 2005

(54) SEMICONDUCTOR DEVICE INCLUDING CAPACITOR

(75) Inventor: Takashi Miyajima, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/369,507

(22) Filed: Feb. 21, 2003

(65) Prior Publication Data

US 2004/0051131 A1 Mar. 18, 2004

(30) Foreign Application Priority Data

Sep. 12, 2002 (JP) ........................................ 2002-267014

(51) Int. Cl.$^7$ ...................... H01L 27/108; H01L 29/76; H01L 29/94; H01L 31/119
(52) U.S. Cl. ........................ 257/306; 257/300; 257/307; 257/308; 257/309
(58) Field of Search ......................... 257/300, 306–308, 257/309

(56) References Cited

U.S. PATENT DOCUMENTS

| | | | | |
|---|---|---|---|---|
| 5,677,238 A | * | 10/1997 | Gn et al. ..................... | 438/653 |
| 5,739,563 A | * | 4/1998 | Kawakubo et al. ......... | 257/295 |
| 5,763,954 A | * | 6/1998 | Hyakutake .................. | 257/774 |
| 5,852,307 A | * | 12/1998 | Aoyama et al. ............. | 257/295 |
| 5,952,687 A | * | 9/1999 | Kawakubo et al. ......... | 257/296 |
| 6,146,941 A | | 11/2000 | Huang et al. | |
| 6,225,185 B1 | * | 5/2001 | Yamazaki et al. .......... | 438/396 |
| 6,239,460 B1 | * | 5/2001 | Kuroiwa et al. ............ | 257/300 |
| 6,288,449 B1 | * | 9/2001 | Bhowmik et al. .......... | 257/762 |
| 6,319,731 B1 | * | 11/2001 | Kang et al. .................. | 438/3 |
| 6,400,022 B1 | * | 6/2002 | Kishida et al. .............. | 257/750 |
| 6,548,357 B2 | * | 4/2003 | Weybright et al. .......... | 438/279 |
| 6,630,705 B2 | * | 10/2003 | Maeda et al. ................ | 257/306 |
| 6,635,933 B2 | * | 10/2003 | Ishibashi et al. ............ | 257/368 |
| 6,717,201 B2 | * | 4/2004 | Roberts et al. .............. | 257/306 |
| 6,787,833 B1 | * | 9/2004 | Fishburn ...................... | 257/296 |
| 6,787,839 B2 | * | 9/2004 | Wu et al. ..................... | 257/306 |
| 6,825,520 B1 | * | 11/2004 | Shue et al. .................. | 257/309 |
| 2001/0001211 A1 | * | 5/2001 | Tanaka et al. ............... | 257/309 |
| 2001/0019141 A1 | * | 9/2001 | Takahashi .................... | 257/295 |
| 2001/0023109 A1 | * | 9/2001 | Yamamoto ................... | 438/396 |
| 2001/0036737 A1 | * | 11/2001 | Iguchi et al. ................ | 438/692 |
| 2002/0074659 A1 | * | 6/2002 | Dalton et al. ................ | 257/758 |
| 2002/0089009 A1 | * | 7/2002 | Kitamura ..................... | 257/306 |
| 2002/0185706 A1 | * | 12/2002 | Ikegami ....................... | 257/529 |

FOREIGN PATENT DOCUMENTS

| | | |
|---|---|---|
| JP | 10-50951 | 2/1998 |
| JP | 11-135749 | 5/1999 |

* cited by examiner

*Primary Examiner*—Amir Zarabian
*Assistant Examiner*—Ida M. Soward
(74) *Attorney, Agent, or Firm*—McDermott Will & Emery LLP

(57) ABSTRACT

A semiconductor device is obtained that can prevent occurrence of a shape defect of a capacitor electrode in the semiconductor device or operation failure of the semiconductor device. A semiconductor device with the capacitor includes a second interlayer insulation film, an SC poly plug, a barrier metal and an SN electrode. The second interlayer insulation film has a through hole. The SC poly plug is formed within the through hole of the second interlayer insulation film. The barrier metal is formed on the SC poly plug. The SN electrode is formed on the barrier metal. The SN electrode is electrically connected to the SC poly plug with the barrier metal interposed therebetween. The barrier metal is a multilayer film including three layers of a tantalum nitride (TaN) film, a titanium nitride (TiN) film and a titanium (Ti) film.

7 Claims, 19 Drawing Sheets

SEMICONDUCTOR DEVICE INCLUDING CAPACITOR

BACKGROUND OF THE INVENTION

1. Field of the Invention

The present invention relates to a semiconductor device, and more particularly, to a semiconductor device having a capacitor with an MIM (Metal/Insulator/Metal) structure.

2. Description of the Background Art

Conventionally, a semiconductor memory device such as a DRAM (Dynamic Random-Access Memory) is known as one of semiconductor devices. It is strongly required for such a semiconductor memory device to be reduced in size and highly integrated. As semiconductor memory devices are highly integrated, the size of a capacitor (storage node) constituting a memory cell and the distance between adjacent capacitors have been reduced. A capacitor must ensure a constant electrostatic capacitance, even though its size is reduced. Thus, a metal material such as ruthenium (Ru) has recently been used as a material of a capacitor electrode. Moreover, a capacitor with the MIM structure (hereinafter also referred to as an MIM capacitor) that uses a high dielectric film such as tantalum oxide ($Ta_2O_5$) as a capacitor dielectric film has been employed.

FIG. 31 is a schematic plan view of a conventional semiconductor device having the MIM capacitor described above. FIG. 32 is a schematic section view taken along the line XXXII—XXXII in FIG. 31. The conventional semiconductor device will be described with reference to FIGS. 31 and 32.

The semiconductor device shown in FIGS. 31 and 32 is a semiconductor memory device including a plurality of gate electrodes 103 formed to be arranged in parallel at predetermined intervals on a main surface of a semiconductor substrate 101 (see FIG. 32). Each of gate electrodes 103 forms a gate electrode of a field effect transistor constituting a memory cell, as will be described later. In addition, at a layer above gate electrodes 103, a plurality of bit lines 150 (see FIG. 31) are formed with a prescribed distance from gate electrodes 103, extending in a direction substantially perpendicular to the direction of gate electrodes 103 extending. Bit lines 150 are electrically connected to a conductive region formed on the main surface of semiconductor substrate 101 (see FIG. 32) through a conductive material embedded in bit line contacts 151. A plurality of capacitors are then arranged in a matrix between gate electrodes 103 and bit lines 150. The structure of the semiconductor device will specifically be described with reference to FIG. 32.

As shown in FIG. 32, the conventional semiconductor device includes a field effect transistor formed on the main surface of semiconductor substrate 101 and a capacitor electrically connected to source/drain regions (not shown) of the field effect transistor. Specifically, an isolation oxide film 102 is so formed on the main surface of semiconductor substrate 101 as to enclose an element-forming region. Gate electrode 103 is formed on the main surface of semiconductor substrate 101 and isolation oxide film 102 with a gate insulation film (not shown) interposed in between. An insulation film 105 is formed on an upper surface and sidewall surfaces of gate electrode 103. Moreover, though not shown, a source/drain region, i.e. a conductive region into which conductive impurities are implanted, is formed on the main surface of semiconductor substrate 101 so as to be adjacent to gate electrode 103.

A first interlayer insulation film 106 is formed on insulation film 105. In first interlayer insulation film 106, contact holes 107a, 107b reaching the main surface of semiconductor substrate 101 are formed between gate electrodes 103. Contact holes 107a, 107b are filled with poly landing pads 108a, 108b made of a conductive material such as polysilicon.

A second interlayer insulation film 109 is formed on an upper surface of first interlayer insulation film 106. In second interlayer insulation film 109, through holes 110a, 110b are formed, respectively, at regions located above poly landing pads 108a, 108b. SC (storage node contact) barrier metal plugs 152a, 152b are formed within through holes 110a, 110b so as to be in contact with poly landing pads 8a, 8b. SC barrier metal plugs 152a, 152b are made of a titanium nitride (TiN) film.

An SN interlayer insulation film 113 is formed on second interlayer insulation film 109. In SN interlayer insulation film 113, openings 114a, 114b are formed at regions located above SC barrier metal plugs 152a, 152b, respectively. SN electrodes 117a, 117b made of a ruthenium film are arranged within openings 114a, 114b. A capacitor dielectric film 118 is formed on SN electrodes 117a, 117b so as to extend from the inside of openings 114a, 114b to an upper surface of SN interlayer insulation film 113. Capacitor dielectric film 118 is made of a tantalum oxide ($Ta_2O_5$) film. A cell plate electrode 119 (CP electrode 119) is formed on capacitor dielectric film 118. A contact interlayer insulation film 120 is formed on cell plate electrode 119. Contact interlayer insulation film 120 is made of, for example, a plasma TEOS oxide film. An aluminum interconnection 121 is formed on contact interlayer insulation film 120. A passivation film 122 is formed covering aluminum interconnection 121.

FIGS. 33 to 37 are schematic section views for illustrating a manufacturing method of the conventional semiconductor device shown in FIGS. 31 and 32. The manufacturing method of the conventional semiconductor device shown in FIGS. 31 and 32 will be described with reference to FIGS. 33 to 37.

First, isolation oxide film 102 is so formed on the main surface of semiconductor substrate 101 (see FIG. 33) as to enclose the element-forming region. Then, a field effect transistor constituted by gate electrode 103 as shown in FIG. 33 and the like, and insulation film 105 are formed by a conventionally-used technique.

Thereafter, first interlayer insulation film 106 (see FIG. 33) having contact holes 107a, 107b (see FIG. 33) is formed on insulation film 105. Subsequently, a polysilicon film is so formed as to fill in contact holes 107a, 107b and to extend onto the upper surface of first interlayer insulation film 106. The polysilicon film located on the upper surface of first interlayer insulation film 106 is then removed by a CMP technique or the like to form poly landing pads 108a, 108b (see FIG. 33).

Subsequently, second interlayer insulation film 109 (see FIG. 33) is formed on first interlayer insulation film 106. Second interlayer insulation film 109 is a so-called storage node contact (SC) interlayer insulation film, the material of which may be, for example, a BPTEOS (Boro Phospho Tetra Ethyl Ortho Silicate) film. Second interlayer insulation film 109 may have a thickness of e.g. 450 nm. A resist film having a prescribed pattern is formed on second interlayer insulation film 109 by a photolithography technique. The resist film is used as a mask to partially remove second interlayer insulation film 109 by anisotropic etching such as dry etching. Thereafter, the resist film is removed. As a result, through holes 10a, 10b can be formed as shown in FIG. 33.

Next, a titanium nitride film (TiN film) is deposited by a CVD (Chemical Vapor Deposition) technique so as to extend from the inside of through holes 110a, 110b to the upper surface of second interlayer insulation film 109. A portion of the titanium nitride film located on the upper surface of second interlayer insulation film 109 is then removed by the CMP (Chemical Mechanical Polishing) technique. As a result, SC barrier metal plugs 152a, 152b made of a titanium nitride film are obtained as shown in FIG. 33.

Next, SN interlayer insulation film 113 (see FIG. 34) is formed on second interlayer insulation film 109. A BPTEOS film may be used, for example, as a material of SN interlayer insulation film 113. SN interlayer insulation film 113 may have a thickness of e.g. 1000 nm. Subsequently, a resist film having a prescribed pattern is formed on SN interlayer insulation film 113 by the photolithography technique. The resist film is used as a mask to partially remove SN interlayer insulation film 113 by anisotropic etching. Thereafter, the resist film is removed. As a result, openings 114a, 114b that expose SC barrier metal plugs 152a, 152b can be formed in SN interlayer insulation film 113 as shown in FIG. 34.

Next, as shown in FIG. 35, a Ru (ruthenium) film 127 is so formed as to extend from the inside of openings 114a, 114b to the upper surface of SN interlayer insulation film 113. Ru film 127 is formed such that a Ru film is first deposited extending from the inside of openings 114a, 114b to the upper surface of SN interlayer insulation film 113 by a sputtering technique. This Ru film may have a thickness of e.g. 20 nm. Thereafter, the CVD technique is used to continuously deposit the Ru film. Thus, Ru film 127 having a substantially uniform thickness may be formed.

Next, the CMP technique is used to partially remove Ru film 127 located on the upper surface of SN interlayer insulation film 113. As a result, as shown in FIG. 36, SN electrodes 117a, 117b made of the Ru film can be obtained.

Next, as shown in FIG. 37, capacitor dielectric film 118 is so formed as to extend from the surfaces of SN electrodes 117a, 117b to the upper surface of SN interlayer insulation film 113. A tantalum oxide ($Ta_2O_5$) film maybe used as capacitor dielectric film 118. Capacitor dielectric film 118 is formed by first depositing e.g. a tantalum oxide film to a prescribed thickness, followed by oxidation of the tantalum oxide film using ozone ($O_3$) gas or the like for crystallization. The initially deposited tantalum oxide film may have a thickness of e.g. 12 nm. Further, for process conditions in oxidizing the tantalum oxide film described above, an atmospheric temperature may be set to 400° C. and ozone ($O_3$) gas may be used as atmospheric gas.

The Ru film is deposited on capacitor dielectric film 118 to form cell plate electrode 119 (see FIG. 32). In addition, contact interlayer insulation film 120 (see FIG. 32) is formed on cell plate electrode 119. A BPTEOS film may be used as contact interlayer insulation film 120. An aluminum film (not shown) is formed on contact interlayer insulation film 120. A resist film having a pattern is formed on the aluminum film by the photolithography technique. The aluminum film is partially removed by etching or the like using the resist film as a mask, to form aluminum interconnection 121 (see FIG. 32). Thereafter, the resist film is removed. Passivation film 122 (see FIG. 32) is then formed to cover aluminum interconnection 121 and the upper surface of contact interlayer insulation film 120. Thus, the semiconductor device shown in FIG. 32 can be obtained.

The conventional semiconductor device shown above, however, had the problems as described below. In the oxidation process for forming capacitor dielectric film 118 shown in FIG. 37, a ruthenium film forming SN electrodes 117a, 117b that are capacitor electrodes is oxidated. When this occurrs, adhesion between SN interlayer insulation film 113 of the BPTEOS film and the ruthenium film forming SN electrodes 117a, 117b is deteriorated. This may have produced an air gap 153 between SN electrodes 117a, 117b and SN interlayer insulation film 113, as shown in FIG. 38. It is noted that FIG. 38 is a schematic section view for illustrating the problem of the conventional semiconductor device. Such air gap 153 would result in a cause of a shape defect of SN electrodes 117a, 117b.

Furthermore, in the oxidation process, oxidation species contained in the ozone gas may reach SC barrier metal plugs 152a, 152b made of a titanium nitride film. If the oxidation species thus reaches SC barrier metal plugs 152a, 152b, SC barrier metal plugs 152a, 152b are oxidated. This causes a problem of increase of an electric resistance in SC barrier meal plugs 152a, 152b. If the electric resistance of SC barrier metal plugs 152a, 152b thus increases, the semiconductor device is prevented from performing normal operation (operation failure occurs), resulting in a defective product.

SUMMARY OF THE INVENTION

An object of the present invention is to provide a semiconductor device that can prevent a shape defect of a capacitor electrode in the semiconductor device and operation failure of the semiconductor device.

According to one aspect of the present invention, a semiconductor device including a capacitor includes a base insulation film, a conductive material, a barrier metal film, and a capacitor lower electrode including metal. The base insulation film has an opening. The conductive material is formed within the opening of the base insulation film. The barrier metal film is formed on the conductive material. The capacitor lower electrode is formed on the barrier metal film. The capacitor lower electrode is electrically connected to the conductive material with the barrier metal film interposed in between. The barrier metal film is a multilayer film including three layers of a tantalum nitride (TaN) film, a titanium nitride (TiN) film and a titanium (Ti) film.

Thus, when the oxidation process is performed to form the capacitor dielectric film on the capacitor lower electrode, the oxidation species used in the oxidation process is blocked by tantalum nitride forming the multilayer film, reducing the risk of the oxidation species reaching an interface region between the conductive film and the multilayer film. This can prevent the interface between the multilayer film (barrier metal film) and the conductive film from being oxidated by the oxidation species. Thus, the problem of increase in the electric resistance at the interface between the barrier metal film and the conductive film occurring due to oxidation of the interface can be prevented. Therefore, the probability of occurrence of operation failure of the semiconductor device associated with increase in the electric resistance can be reduced.

According to another aspect of the present invention, a semiconductor device including a capacitor includes an insulation film and a capacitor lower electrode including metal. The insulation film has an opening for capacitor. The capacitor lower electrode is arranged within the opening for capacitor. The capacitor lower electrode has a titanium nitride film and a conductive film. The titanium nitride film is so arranged as to abut on the inner wall of the opening for capacitor. The conductive film is formed on the titanium nitride film and includes metal.

Thus, the titanium nitride film may be utilized as a bonding layer between the capacitor lower electrode and the insulation film. In particular, when a BPTEOS film is used as an insulation film, the BPTEOS film has good adhesion to the titanium nitride film, reducing the risk of the capacitor lower electrode being separated from the insulation film. This can lower the possibility of a shape defect occurring due to the separation in the capacitor lower electrode.

According to a further aspect of the present invention, a semiconductor device including a capacitor includes a base insulation film, a conductive material, an insulation film, and a capacitor lower electrode including metal. The base insulation film has an opening. The conductive material is formed within the opening of the base insulation film. The insulation film is formed on the base insulation film. The base insulation film has an opening for capacitor that exposes the conductive material. The capacitor lower electrode is formed within the opening for capacitor. Further, the capacitor lower electrode is electrically connected to the conductive material. The capacitor lower electrode includes a multilayer film that abuts on the conductive material as well as the inner walls of the opening for capacitor. The multilayer film includes three layers of a tantalum nitride film, a titanium nitride film and a titanium film.

Thus, when an oxidation process is performed for forming the capacitor dielectric film on the capacitor lower electrode, oxidation species used in the oxidation process are blocked by tantalum nitride forming the multilayer film, reducing the risk of the oxidation species reaching an interface region between the conductive film and the multilayer film. This can prevent the interface between the multilayer film and the conductive film forming a capacitor lower electrode from being oxidated by the oxidation species. Thus, the problem of increase of the electric resistance at the interface between the capacitor lower electrode and the conductive film occurring due to oxidation of the interface can be prevented.

Moreover, the multilayer film forming the capacitor lower electrode may act as a bonding layer for improving adhesion between the capacitor lower electrode and the insulation film. This can reduce the risk of separation at the bonding interface between the insulation film and the capacitor lower electrode. As a result, occurrence of a shape defect associated with the separation of the capacitor lower electrode can be prevented.

According to yet another aspect of the present invention, a semiconductor device including a capacitor includes an insulation film and a capacitor lower electrode including metal. The insulation film has an opening for capacitor. The capacitor lower electrode is arranged within the opening for capacitor. The capacitor lower electrode has a film including tantalum nitride and a conductive film. The film including tantalum nitride is arranged to abut on the inner walls of the opening for capacitor. The conductive film is formed on the film including tantalum nitride, and includes metal.

Thus, the film including tantalum nitride forming the capacitor lower electrode may be utilized as a bonding layer for improving adhesion between the capacitor lower electrode and the insulation film. This can reduce the risk of separation at the bonding interface between the insulation film and the capacitor lower electrode. This can prevent occurrence of a shape defect associated with the separation of the-capacitor lower electrode.

Moreover, when an oxidation process is performed for forming a capacitor dielectric film on the capacitor lower electrode, oxidation species used in the oxidation process is blocked by the film including tantalum nitride. This can lower the possibility of oxidation of the bonding interface between the capacitor lower electrode and a conductive plug or the like formed on a layer lower than the capacitor lower electrode and connected with the capacitor lower electrode, by the oxidation species.

According to a still further aspect of the present invention, a semiconductor device including a capacitor includes a capacitor lower electrode including metal, a capacitor dielectric film and a capacitor upper electrode. The capacitor lower electrode is formed on the semiconductor substrate and is tubular. The capacitor dielectric film is formed to cover the inner and outer circumferential surfaces of the capacitor lower electrode. The capacitor upper electrode is formed on the capacitor dielectric film. The capacitor lower electrode includes a titanium film and a conductive film. The conductive film is formed on the titanium film. The conductive film is tubular and includes metal.

Thus, both the inner and outer circumferential surfaces of the tubular conductive film forming the capacitor lower electrode can be utilized as the capacitor lower electrode. Accordingly, the electrostatic capacitance of the capacitor can be increased compared to the case where the capacitor dielectric film is formed only on the inner circumferential surface of the tubular conductive film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
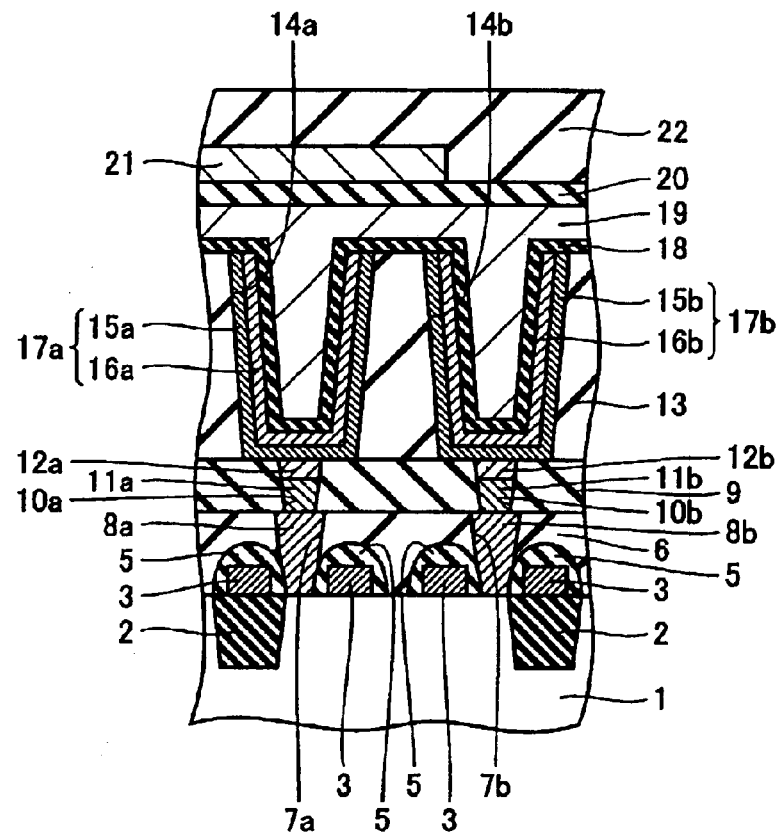
FIG. 1 is a schematic section view showing the first embodiment of the semiconductor device according to the present invention.

Embodiments of the present invention will be described below with reference to the drawings. It is noted that the same or corresponding portions in the drawings are denoted by the same reference numbers, and the description thereof will not be repeated.

First Embodiment

Figure 2:
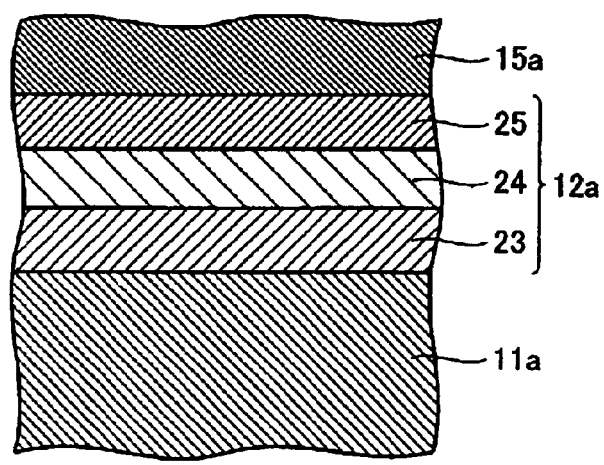
FIG. 2 is a partially enlarged schematic section view of the semiconductor device shown in FIG. 1.
Figure 31:
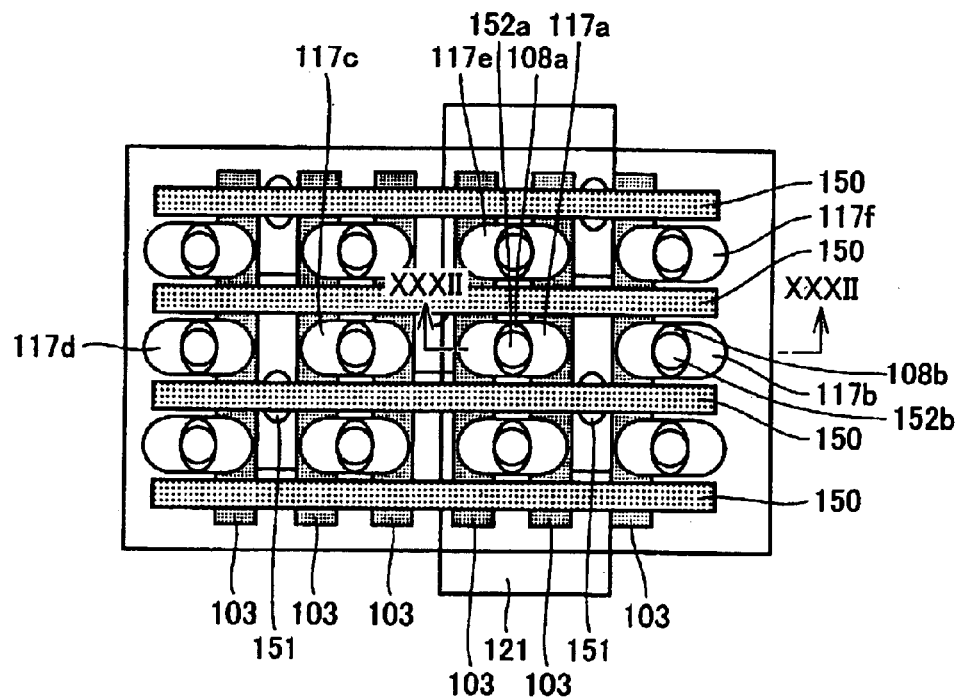
FIG. 31 is a schematic plan view of the conventional semiconductor device.
Figure 32:
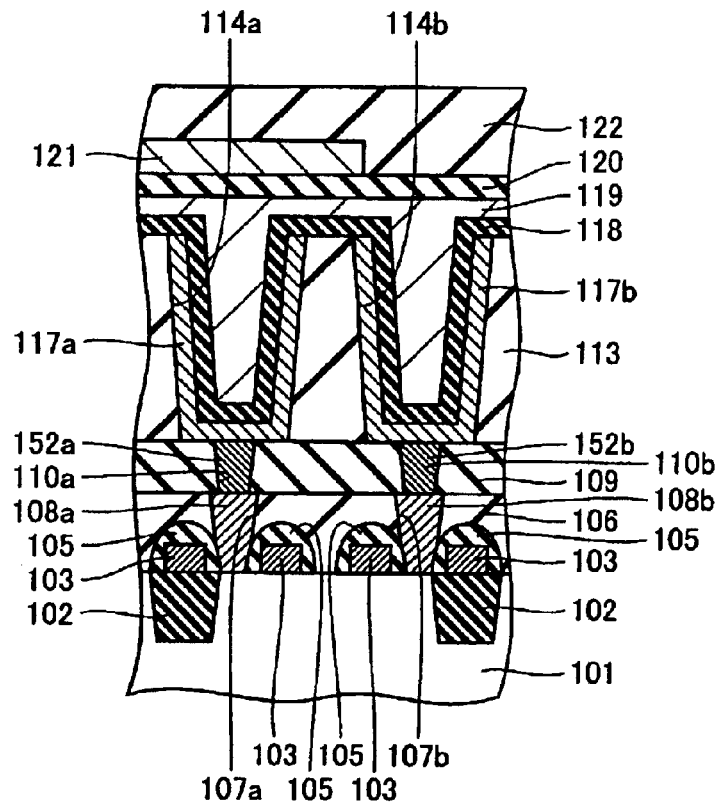
FIG. 32 is a schematic section view taken along the line XXXII—XXXII in FIG. 31.
Figure 33:
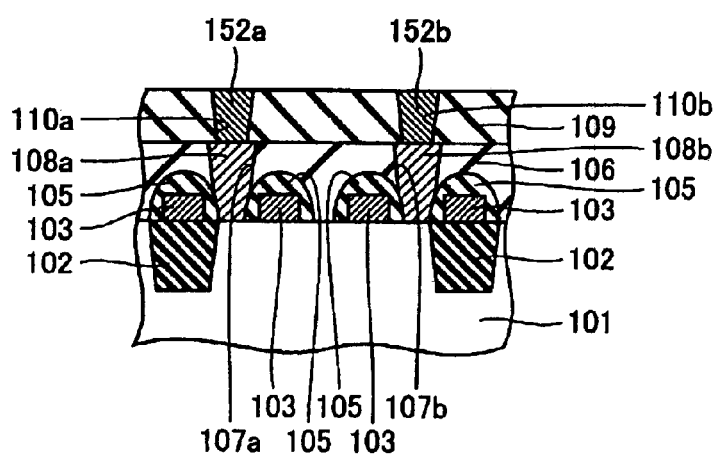
FIGS. 33 to 37 are schematic section views for illustrating the first to the fifth steps of the manufacturing method of the conventional semiconductor device shown in FIGS. 31 and 32.
Figure 34:
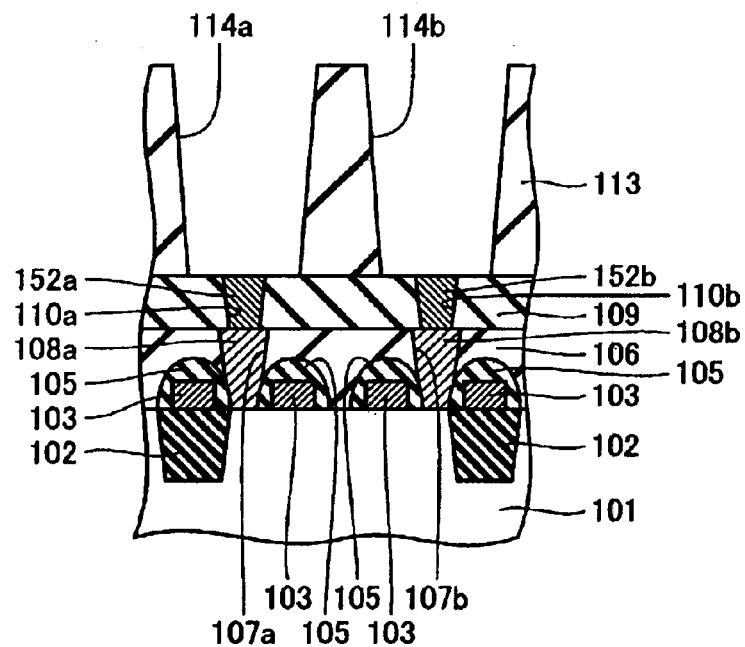
Figure 35:
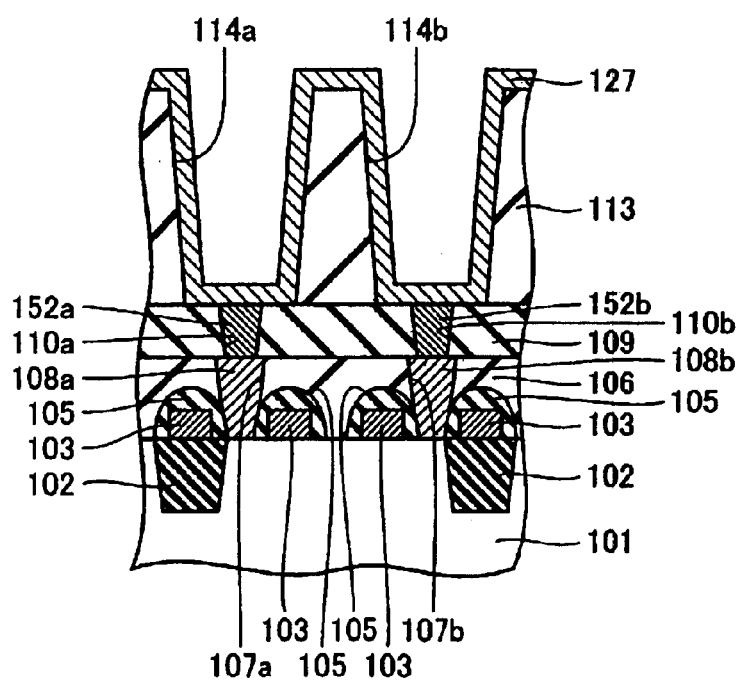
Figure 36:
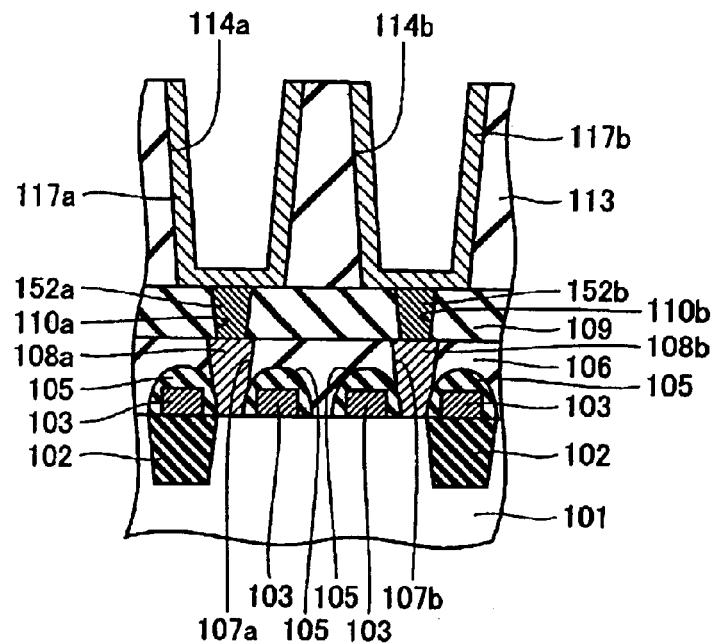
Figure 37:
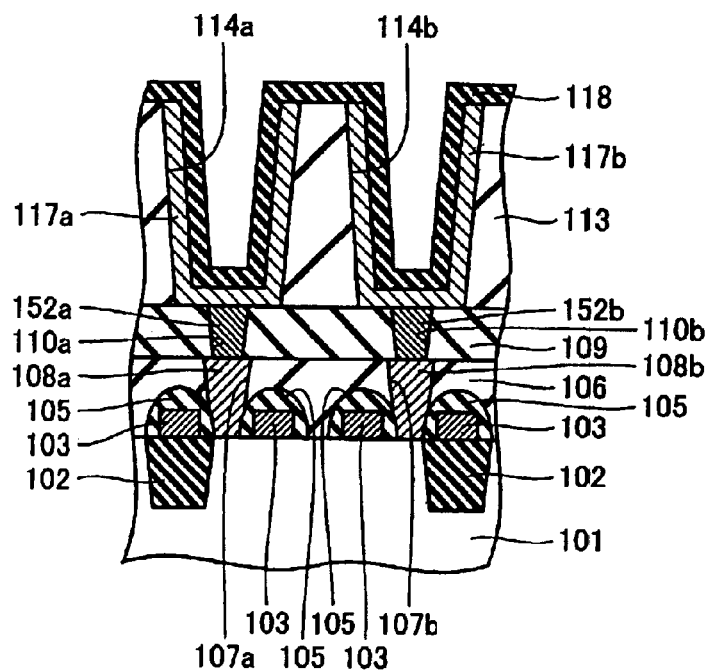
Figure 38:
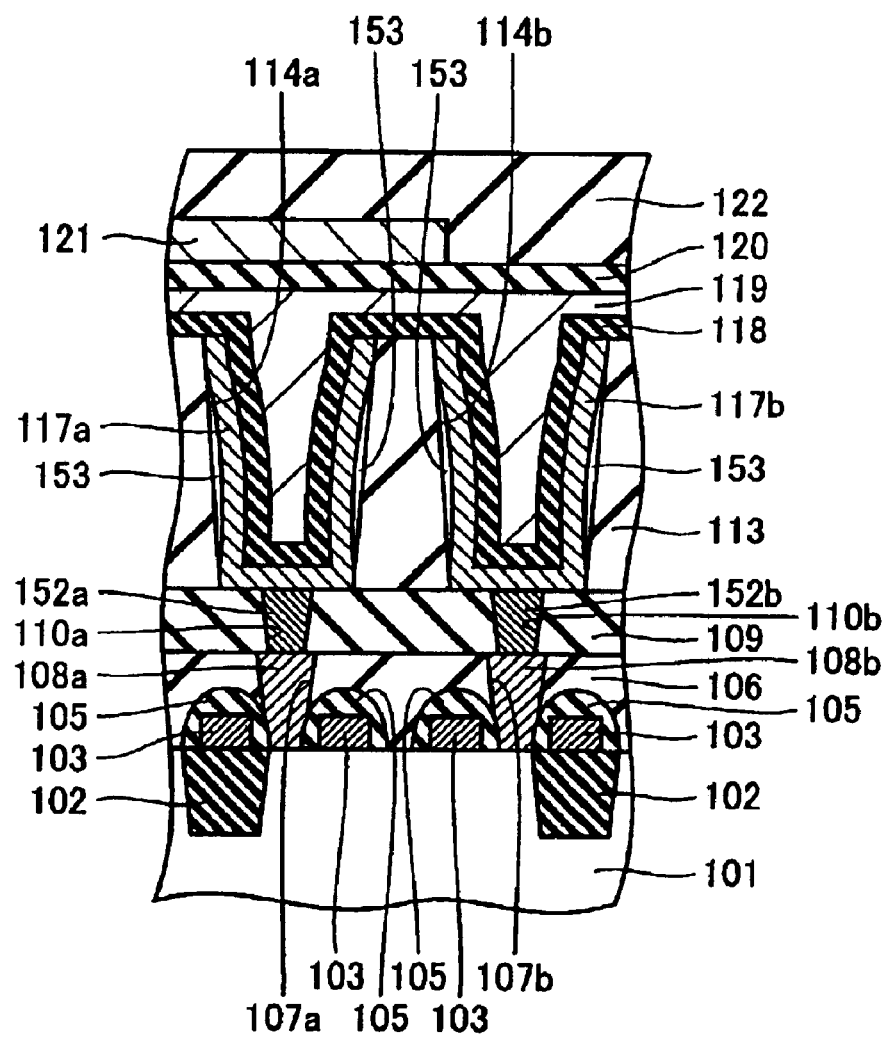
FIG. 38 is a schematic section view for illustrating problems in the conventional semiconductor device.

Referring to FIGS. 1 and 2, the first embodiment of a semiconductor device according to the present invention is described. It is noted that FIG. 1 corresponds to FIG. 32. Moreover, the plane shape of the semiconductor device shown in FIG. 1 is basically similar to the plane shape of the conventional semiconductor device shown in FIG. 31.

As shown in FIGS. 1 and 2, the semiconductor device according to the present invention is a semiconductor memory device including a field effect transistor and a capacitor formed on the main surface of a semiconductor substrate 1 and forming a memory cell. The capacitor is electrically connected to a source/drain region (not shown) of the field effect transistor. Specifically, an isolation oxide film 2 is formed on the main surface of semiconductor substrate 1 so as to enclose an element-forming region. Gate electrodes 3 are formed on the main surface of semiconductor substrate 1 and on the isolation oxide film 2 with a gate insulation film (not shown) interposed in between. An insulation film 5 serving as a mask when conductive impurities are implanted for forming the source/drain region and the like on the main surface of semiconductor substrate 1 is formed on an upper surface and sidewall surfaces of gate electrode 3. Though not shown, the source/drain region, i.e. a conductive region into which conductive impurities are implanted, is formed on the main surface of semiconductor substrate 1, so as to be adjacent to gate electrode 3. Gate electrode 3, the gate insulation film and the source/drain region constitute the field effect transistor.

A first interlayer insulation film 6 is formed on insulation film 5. First interlayer insulation film 6 has contact holes 7a, 7b formed therein that reach the main surface of semiconductor substrate 1 between gate electrode 3. Contact holes 7a, 7b are filled with poly landing pads 8a, 8b made of a conductive material such as polysilicon.

A second interlayer insulation film 9 serving as a base insulation film is formed on the upper surface of first interlayer insulation film 6. At second interlayer insulation film 9, through holes 10a, 10b serving as openings are formed at regions located above poly landing pads 8a, 8b, respectively. In through holes 10a, 10b, SC poly plugs 11a, 11b (storage node contact poly plugs 11a, 11b) acting as conductive materials are so formed as to abut on poly landing pads 8a, 8b. Barrier metals 12a, 12b with a trilaminar structure are formed within through holes 10a, 10b so as to abut on the upper surfaces of SC poly plugs 1a, 1b. Barrier metals 12a, 12b serving as barrier metal films basically have similar structures. Barrier metal 12a is taken as an example in the description below. As shown in FIG. 2, barrier metal 12a is a multilayer film having a trilaminar structure in which three layers of a Ti film 23 (titanium film 23), a TiN film 24 (titanium nitride film 24) and a TaN film 25 (tantalum nitride film 25) are layered in order from the SC poly plug ha side.

An SN interlayer insulation film 13 serving as an insulation film is formed on second interlayer insulation film 9. At SN interlayer insulation film 13, openings 14a, 14b serving as openings for capacitor are formed, respectively, at regions located above barrier metals 12a, 12b. SN (storage node) electrodes 17a, 17b serving as capacitor lower electrodes are arranged within openings 14a, 14b. SN electrodes 17a, 17b are constituted by first SN electrode films 15a, 15b formed to abut on and extend along the side and bottom walls of openings 14a, 14b, and second SN electrode films 16a, 16b layered on first SN electrode films 15a, 15b. Each of first SN electrode films 15a, 15b is made of a titanium nitride (TiN) film. Further, each of second SN electrode films 16a, 16b serving as conductive films including metal is made of a ruthenium (Ru) film.

A capacitor dielectric film 18 is formed on SN electrodes 17a, 17b so as to extend from the inside of opening portions 14a, 14b to the upper surface of SN interlayer insulation film 13. Capacitor dielectric film 18 is made of a tantalum oxide ($Ta_2O_5$) film. A cell plate electrode 19 (CP electrode 19) serving as a capacitor upper electrode is formed on capacitor dielectric film 18. A contact interlayer insulation film 20 is formed on cell plate electrode 19. Contact interlayer insulation film 20 is made of e.g. plasma TEOS film. An aluminum interconnection 21 is formed on contact interlayer insulation film 20. A passivation film 22 is so formed as to cover aluminum interconnection 21.

As such, by forming barrier metals 12a, 12b (see FIG. 1) within through holes 10a, 10b (see FIG. 1) to have a multilayer structure including TaN film 25 (see FIG. 2), oxidation of the interface between a Ti film located lower than TaN film 25 and poly plugs 11a, 11b (see FIG. 1) (or oxidation of SC poly plugs 11a, 11b) can be prevented in the manufacturing method for the semiconductor device shown in FIG. 1. As a result, increase of the electric resistance at the interface can be prevented. This can in turn prevent a so-called storage node contact (SC) resistance from increasing.

Further, the semiconductor device shown in FIG. 1 employs a multilayer structure including a TiN film as the structure of SN electrodes 17a, 17b by arranging the TiN films as first SN electrode films 15a, 15b. Thus, first SN electrode films 15a, 15b can be utilized as adhesion layers for ensuring adhesion between SN interlayer insulation film 13 and SN electrodes 17a, 17b. Accordingly, adhesion between SN interlayer insulation film 13 and SN electrodes 17a, 17b can be improved.

Referring to FIGS. 3 to 10, a manufacturing method for the semiconductor device shown in FIGS. 1 and 2 will be described.

First, isolation oxide film 2 is formed on the main surface of semiconductor substrate 1 (see FIG. 3) so as to enclose the element-forming region. The field effect transistor is then formed on the main surface of semiconductor substrate 1 by a conventionally-used technique. Specifically, an insulation film which is to be a gate insulation film (not shown) is formed on the main surface of semiconductor substrate 1. A conductive film which is to be gate electrode 3 (see FIG. 3) is formed on the insulation film. A resist film having a pattern corresponding to gate electrode 3 (see FIG. 3) is formed on the conductive film by the photolithography technique. The resist is used as a mask to remove the conductive film and the insulation film by anisotropic etching such as dry etching. Thereafter, the resist film is removed. Thus, the gate insulation film (not shown) and gate electrode 3 (see FIG. 3) are formed.

Subsequently, insulation film 5 is formed to cover gate electrode 3. Conductive impurities are implanted into the main surface of semiconductor substrate 1 using insulation film 5 as a mask, to form a source/drain region (not shown). As such, the field effect transistor constituted by the source/drain region, the gate insulation film and gate electrode 3 (see FIG. 3) can be formed.

Subsequently, first interlayer insulation film 6 (see FIG. 3) is formed on insulation film 5. A resist film (not shown) having a pattern is formed on first interlayer insulation film 6 by the photolithography technique. The resist film is used as a mask to partially remove first interlayer insulation film 6 by anisotropic etching. As a result, contact holes 7a, 7b (see FIG. 3) can be formed. Thereafter, the resist film is removed.

Next, a conductive material is so formed as to fill in contact holes 7a, 7b and to extend to the upper surface of first interlayer insulation film 6. For instance, polysilicon may be used as the conductive material. The conductive material located on the upper surface of first interlayer insulation film 6 is removed by the CMP technique or the like to form poly landing pads 8a, 8b (see FIG. 3).

Figure 3:
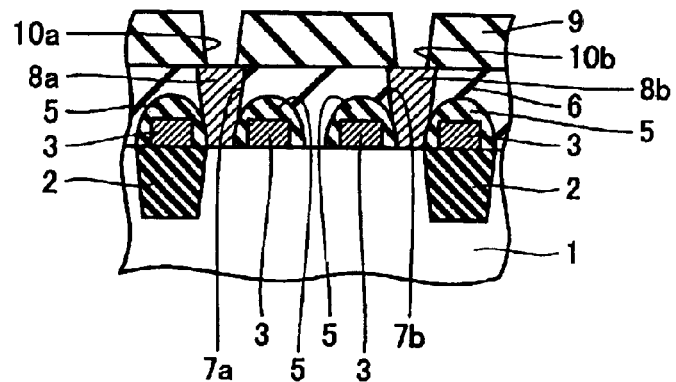
FIGS. 3 to 10 are schematic section views for illustrating the first to the eighth steps of a manufacturing method for the semiconductor device shown in FIGS. 1 and 2.

Second interlayer insulation film 9 (see FIG. 3) is then arranged on first interlayer insulation film 6. The second interlayer insulation film is a so-called storage node contact (SC) interlayer insulation film, and a BPTEOS film may be used, for example, as the material thereof. Second interlayer insulation film 9 may have a thickness of e.g. 450 nm. A resist film having a prescribed pattern is formed on second interlayer insulation film 9 by the photolithography technique. The resist film is used as a mask to partially remove second interlayer insulation film 9 by anisotropic etching. Thereafter, the resist film is removed. As a result, through holes 10a, 10b can be formed as shown in FIG. 3. As such, the step of preparing a base insulation film is performed. This results in the structure as shown in FIG. 3.

Figure 4:
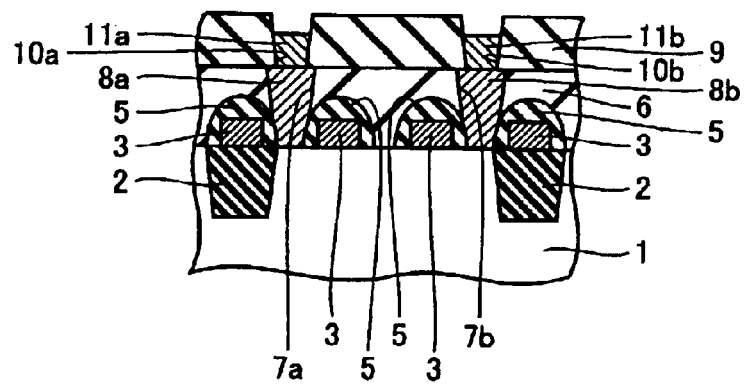

Next, doped polysilicon is so deposited as to extend from the inside of through holes 10a, 10b to the upper surface of second interlayer insulation film 9. The doped polysilicon may have a deposition film thickness of e.g. 200 nm. Thereafter, etchback is performed on the doped polysilicon. As a result, SC poly plugs 11a, 11b recessed from a portion above through holes 10a, 10b by 100 nm can be obtained as shown in FIG. 4. The step of forming a conductive material is thus performed.

Figure 5:
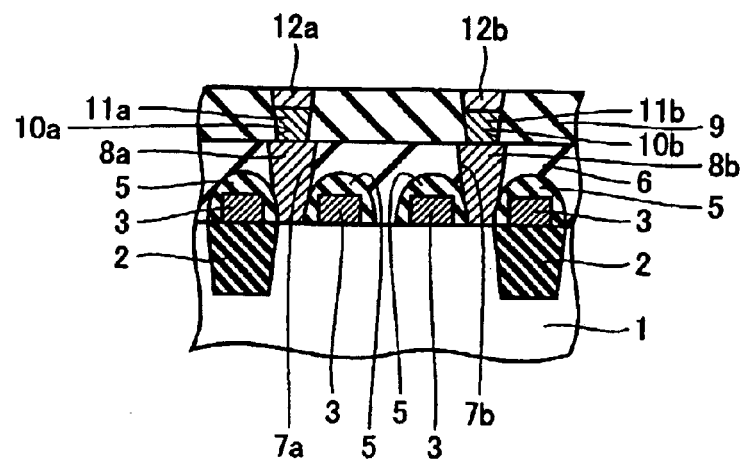

Next, as the step of forming the multilayer film, a metal film which is to be a barrier metal having a trilaminar structure is deposited by the sputtering technique. Specifically, a TiN film is deposited by the sputtering technique so as to extend from the upper surface of SC poly plugs 11a, 11b to the upper surface of second interlayer insulation film 9. A TiN film is deposited on the Ti film by the sputtering technique. A TaN film is deposited on the TiN film by the sputtering technique. Thereafter, the CMP technique is used to remove the trilaminar multilayer film as described above that is located on the upper surface of second interlayer insulating film 9. As a result, as shown in FIG. 5, barrier metals 12a, 12b made of the three films above are formed within through holes 10a, 10b. Accordingly, the structure as shown in FIG. 5 is obtained.

Figure 6:
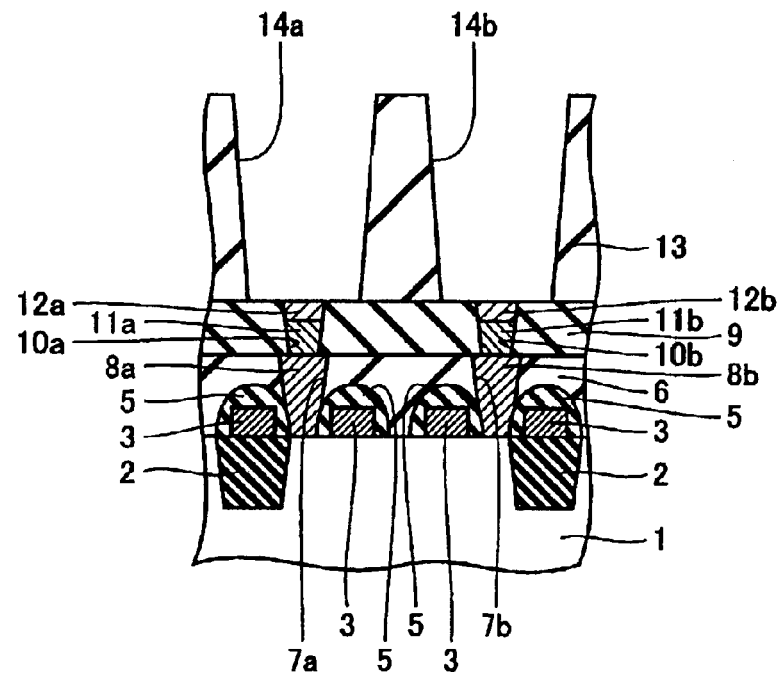

Next, as the step of forming an insulation film, storage node (SN) interlayer insulation film 13 (see FIG. 6) is formed on second interlayer insulation film 9. For instance, a BPTEOS film may be used as a material of SN interlayer insulation film 13. SN interlayer insulation film 13 may have a thickness of e.g. 1000 nm. Subsequently, a resist film having a prescribed pattern is formed on SN interlayer insulation film 13 by the photolithography technique. The resist film is used as a mask to partially remove SN interlayer insulation film 13 by anisotropic etching. Thereafter, the resist film is removed. As a result, in SN interlayer insulation film 13, openings 14a, 14b serving as openings for capacitor to expose barrier metals 12a, 12b may be formed as shown in FIG. 6.

Figure 7:
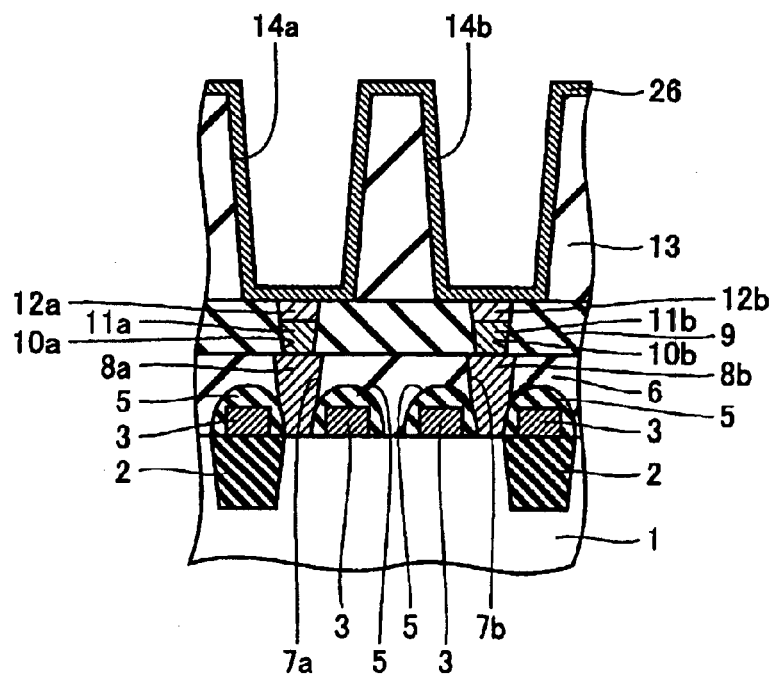

Subsequently, as shown in FIG. 7, in the step of forming a titanium nitride film, titanium nitride (TiN) film 26 which is to be first storage node (SN) electrode films 15a, 15b (see FIG. 1) is deposited by the CVD technique so as to extend from the inside of openings 14a, 14b to the upper surface of SN interlayer insulation film 13.

Figure 8:
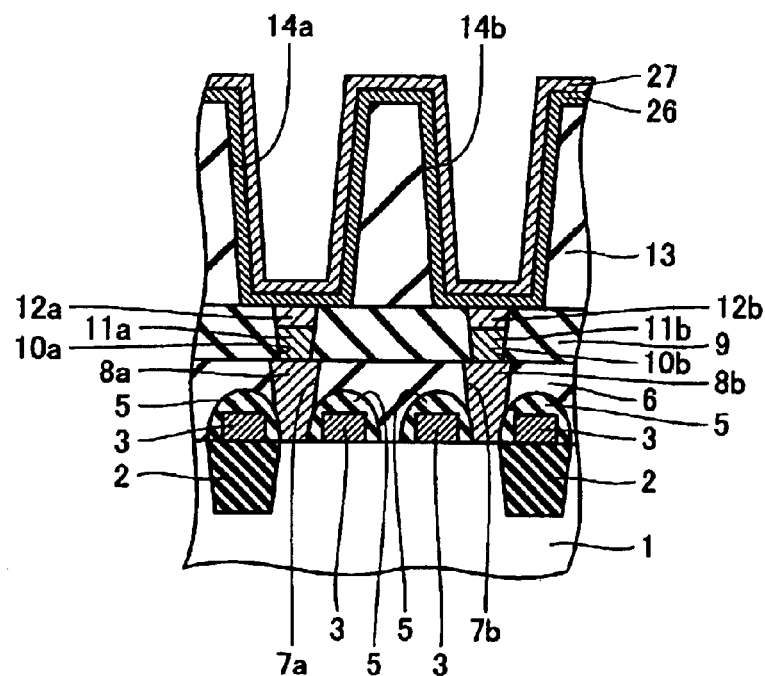

Next, as shown in FIG. 8, in the step of forming a conductive film including metal, Ru film 27 is formed on TiN film 26. Ru film 27 is formed by depositing a Ru film on TiN film 26 to a prescribed thickness by the sputtering technique. The thickness of the Ru film may be e.g. 20 nm. Thereafter, a Ru film is additionally formed by the CVD technique on the Ru film formed by the sputtering technique described above. Thus, Ru film 27 may be formed uniformly on TiN film 26.

Figure 9:
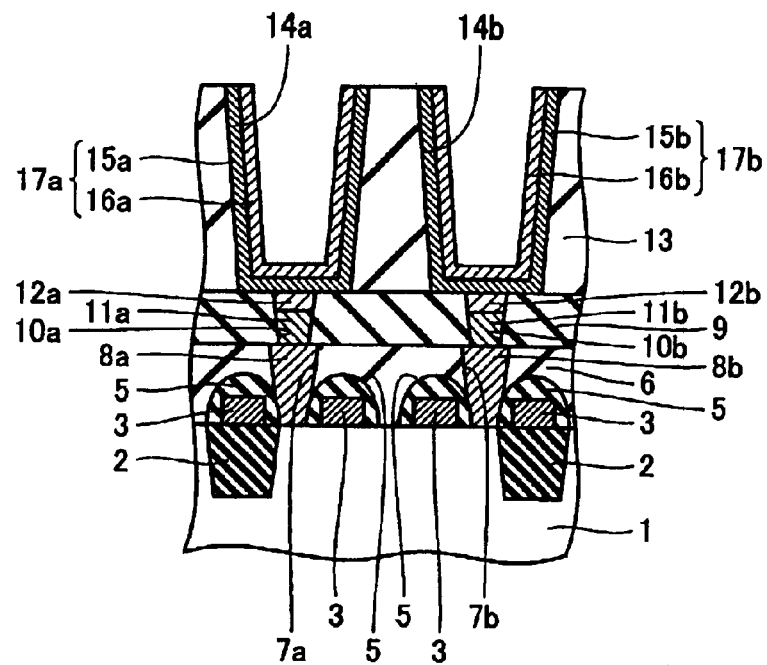

Next, the CMP technique is used to partially remove Ru film 27 and TiN film 26 (see FIG. 8) located on the upper surface of SN interlayer insulation film 13. As a result, first SN electrode films 15a, 15b made of a TiN film and second SN electrode films 16a, 16b made of a Ru film may be formed as shown in FIG. 9. First SN electrode films 15a, 15b and second SN electrode films 16a, 16b constitute SN electrodes 17a, 17b. As such, the step of forming SN electrodes 17a, 17b serving as capacitor lower electrodes is performed.

Figure 10:
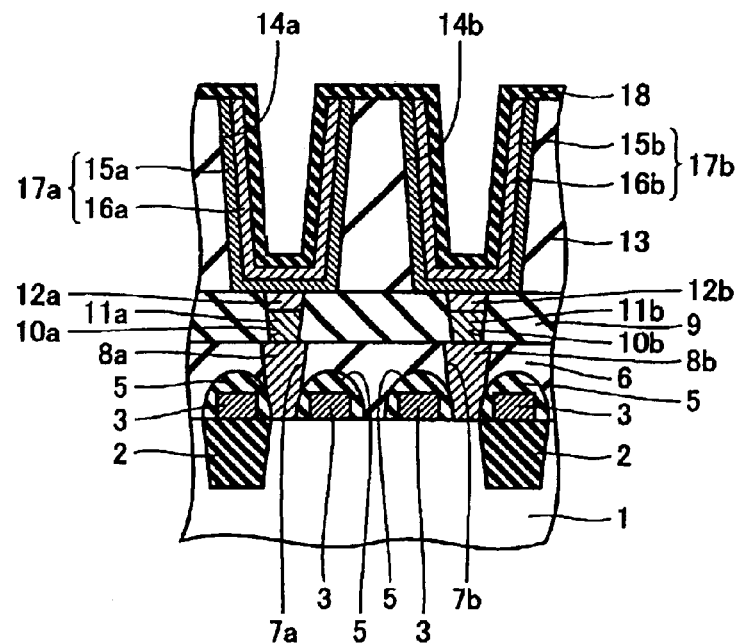

Next, as shown in FIG. 10, capacitor dielectric film 18 is so formed as to extend from the upper side of SN electrodes 17a, 17b to the upper surface of SN interlayer insulation film 13. A tantalum oxide ($Ta_2O_5$) film may be used as a material for forming capacitor dielectric film 18. Capacitor dielectric film 18 may be formed by, for example, a method as described below. First, the tantalum oxide film is deposited to a prescribed thickness. Thereafter, the tantalum oxide film is crystallized by oxidation using ozone ($O_3$) gas. The initially deposited tantalum oxide film may have a thickness of e.g. 12 nm. As such, the structure shown in FIG. 10 is obtained.

Here, second SN electrode films 16a, 16b made of a Ru film that constitute SN electrodes 17a, 17b have good adhesion to first SN electrode films 15a, 15b made of a TiN film. There is also good adhesion between the BPTEOS film forming SN interlayer insulation film 13 and the TiN film forming first SN electrode films 15a, 15b. This can lower the possibility of occurrence of a problem such that a gap is produced between SN electrodes 17a, 17b and SN interlayer insulation film 13 as in the conventional example, in oxidation of the tantalum oxide film using the ozone gas described above.

Moreover, at the oxidation step using ozone gas, the oxidation species contained in the ozone gas are blocked by TaN film 25 (see FIG. 2) forming barrier metals 12a, 12b. This can prevent the oxidation species from reaching the interface between the films located at layers lower than TaN film 25 forming barrier metals 12a, 12b (Ti film 23 and TiN film 24 (see FIG. 2)) and SC poly plugs 11a, 11b. Thus, oxidation of the interface between SC poly plugs 11a, 11b and barrier metals 12a, 12b by the above-described oxidation species can be prevented. As a result, the probability of occurrence of a problem such that the electrical resistance is increased at the above-described interface can be lowered.

Subsequent to the step shown in FIG. 10, a Ru film is deposited on capacitor dielectric film 18 to form cell plate electrode 19 (see FIG. 1). Further, contact interlayer insulation film 20 (see FIG. 1) is formed on cell plate electrode 19. For instance, a plasma TEOS film or a BPTEOS film may be used as contact interlayer insulation film 20. An aluminum film (not shown) is formed on contact interlayer insulation film 20. A resist film having a pattern is formed on the aluminum film by the photolithography technique. The resist film is used as a mask to partially remove the aluminum film by etching or the like, to form aluminum interconnection 21 (see FIG. 1). Thereafter, the resist film is removed. Passivation film 22 (see FIG. 1) is then so formed as to cover aluminum interconnection 21 and the upper surface of contact interlayer insulation film 20. Accordingly, the semiconductor device shown in FIGS. 1 and 2 can be obtained.

Second Embodiment

Figure 11:
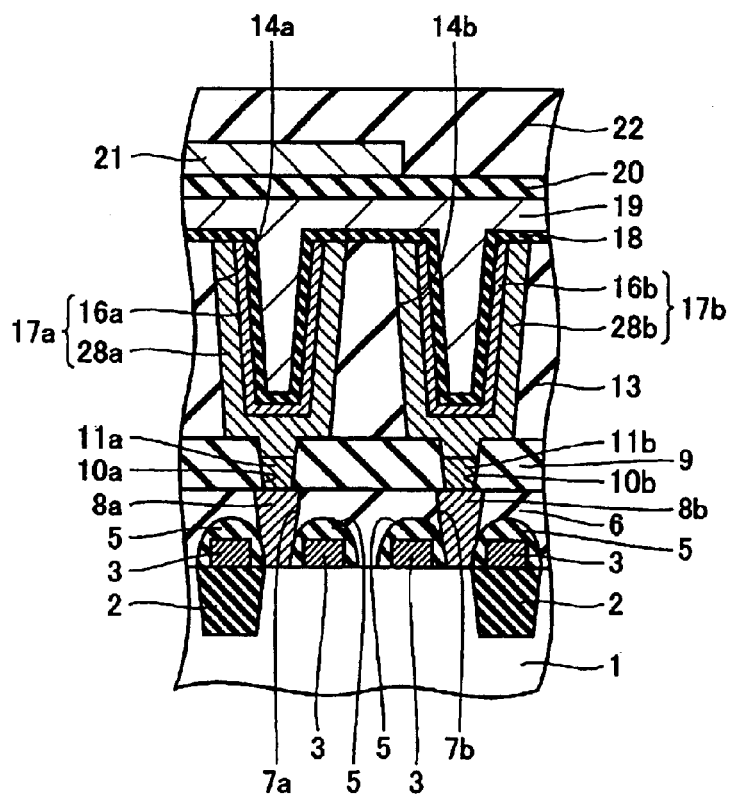
FIG. 11 is a schematic section view showing the second embodiment of the semiconductor device according to the present invention.

Referring to FIG. 11, the second embodiment of the semiconductor device according to the present invention will be described.

As shown in FIG. 11, this semiconductor device basically has a structure similar to that of the semiconductor device shown in FIG. 1, except for the structure of first SN electrode films 28a, 28b, and the structure of a connecting portion between first SN electrode films 28a, 28b and SC poly plugs 11a, 11b. Each of first SN electrode films 28a, 28b forming SN electrodes 17a, 17b in the semiconductor device shown in FIG. 11 has a trilaminar structure of TaN/TiN/Ti (the structure with a Ti film, a TiN film and a TaN film are layered in order from the SC poly plugs 11a, 11b side). Thus, first SN electrode films 28a, 28b serving as capacitor lower electrode multilayer films or multilayer films form the surfaces of SN electrodes 17a, 17b that abut on SN interlayer insulation film 13 and have the same multilayer structure as that of barrier metals 12a, 12b in the first embodiment. First SN electrode films 28a, 28b are formed to extend to the inside of through holes 10a, 10b. In through holes 10a, 10b, first SN electrode films 28a, 28b (specifically, the Ti films forming first SN electrode films 28a, 28b) are in direct contact with the upper surfaces of SC poly plugs 11a, 11b.

As such, first SN electrode films 28a, 28b have the same multilayer film structure as that of barrier metals 12a, 12b (see FIG. 1) in the first embodiment of the present invention while in direct contact with SC poly plugs 11a, 11b within through holes 10a, 10b, so that first SN electrode films 28a, 28b can function as barrier metals 12a, 12b (see FIG. 1). This can eliminate the step of forming barrier metals 12a, 12b (see FIG. 1).

Referring to FIGS. 12 to 16, a manufacturing method for the semiconductor device shown in FIG. 11 will be described.

Figure 12:
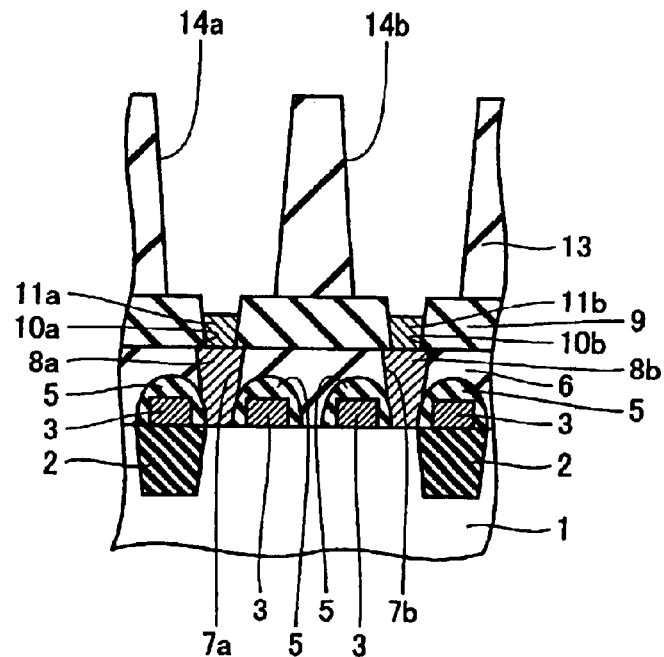
FIGS. 12 to 16 are schematic section views for illustrating the first to the fifth steps of the manufacturing method for the semiconductor device shown in FIG. 11.

First, after the steps shown in FIGS. 3 and 4 in the first embodiment of the present invention, SN interlayer insulation film 13 (see FIG. 12) is formed on second interlayer insulation film 9 as the step of forming an insulation film, rather than forming the barrier metal film as in the first embodiment of the present invention. SN interlayer insulation film 13 may have a thickness of e.g. 1000 nm. For instance, a BPTEOS film is used as a material of SN interlayer insulation film 13. Then, as in the first embodiment of the present invention, a resist film (not shown) having a pattern is formed on SN interlayer insulation film 13 by the photolithography technique. The resist film is used as a mask to partially remove SN interlayer insulation film 13 by anisotropic etching. As a result, openings 14a, 14b (see FIG. 12) are formed. Thereafter, the resist film is removed. As such, the structure as shown in FIG. 12 is obtained.

Figure 13:
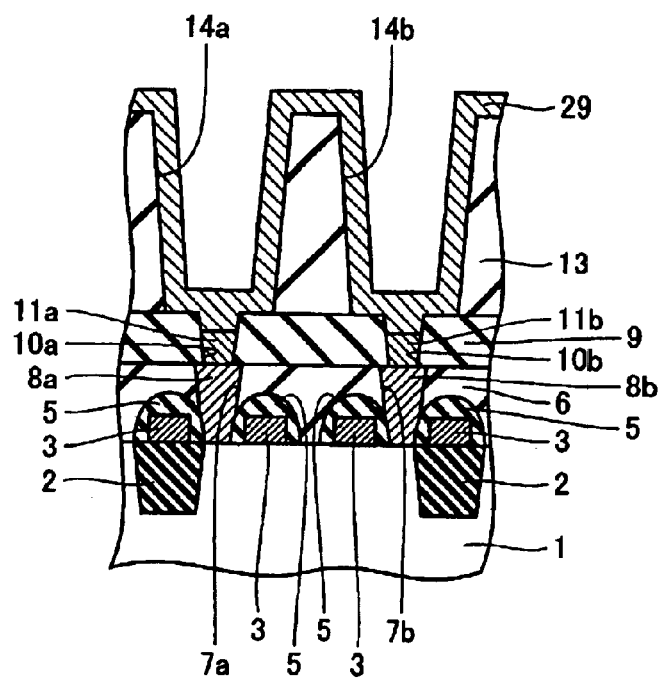

Next, as shown in FIG. 13, in the step of forming a multilayer film, a multilayer film 29 having a trilaminar structure of TaN/TiN/Ti extending from the inside of openings 14a, 14b to the upper surface of SN interlayer insulation film 13. Specifically, a Ti film is first formed by the sputtering technique so as to extend from the inside of openings 14a, 14b to the upper surface of SN interlayer insulation film 13. A TiN film is formed on the Ti film by the sputtering technique. A TaN film is formed on the TiN film by the sputtering technique. Accordingly, the structure as shown in FIG. 13 is obtained.

Figure 14:
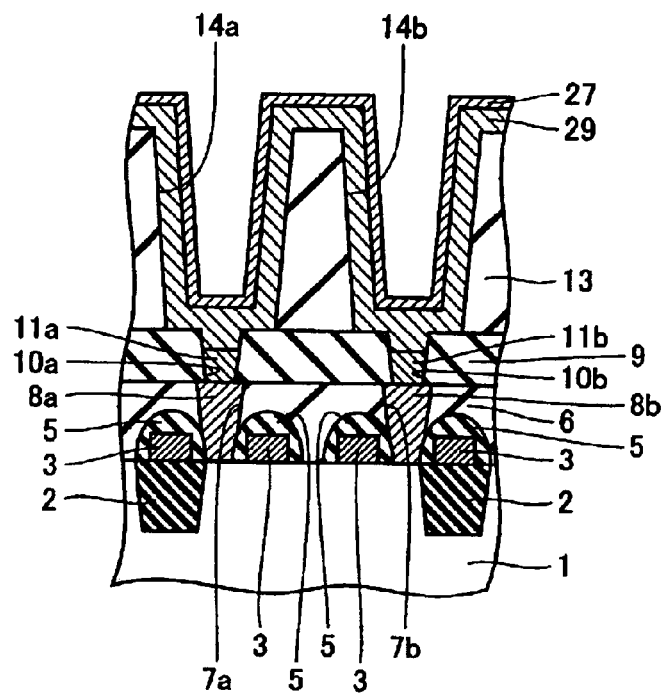

Next, as shown in FIG. 14, as the step of forming a conductive film, Ru film 27 is formed on multilayer film 29. Specifically, a Ru film having a thickness of 20 nm is first deposited on multilayer film 29 by the sputtering technique. Thereafter, a further Ru film is deposited on the initially deposited Ru film by the CVD technique. As a result, Ru film 27 having a substantially uniform thickness can be formed on multilayer film 29.

Figure 15:
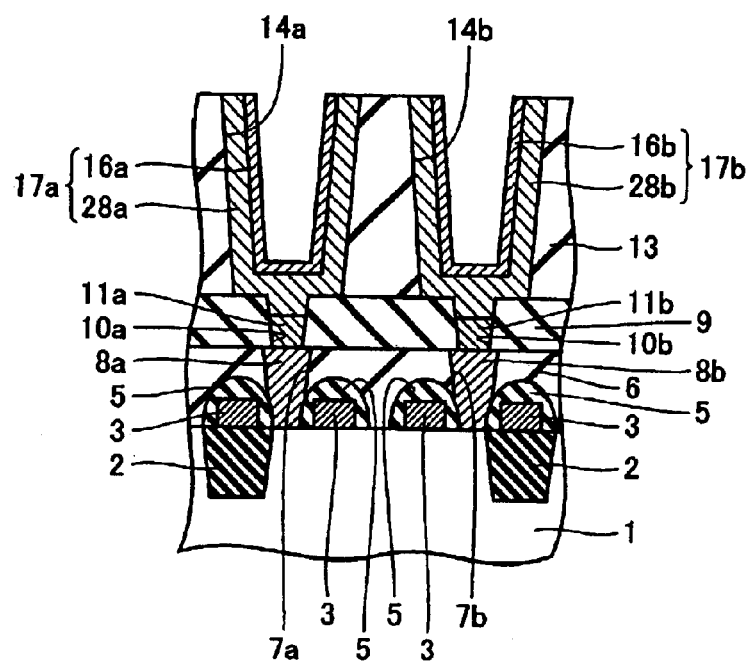

Next, the CMP technique is used to remove portions of Ru film 27 (see FIG. 14) and multilayer film 29 (see FIG. 14) located on the upper surface of SN interlayer insulation film 13 (see FIG. 14). As a result, as shown in FIG. 15, first SN electrode films 28a, 28b of a multilayer film and second SN electrode films 16a, 16b of a Ru film can be formed, respectively, within openings 14a, 14b. First SN electrode films 28a, 28b and second SN electrode films 16a, 16b form SN electrodes 17a, 17b. Thus, the step of forming a capacitor lower electrode is performed.

Figure 16:
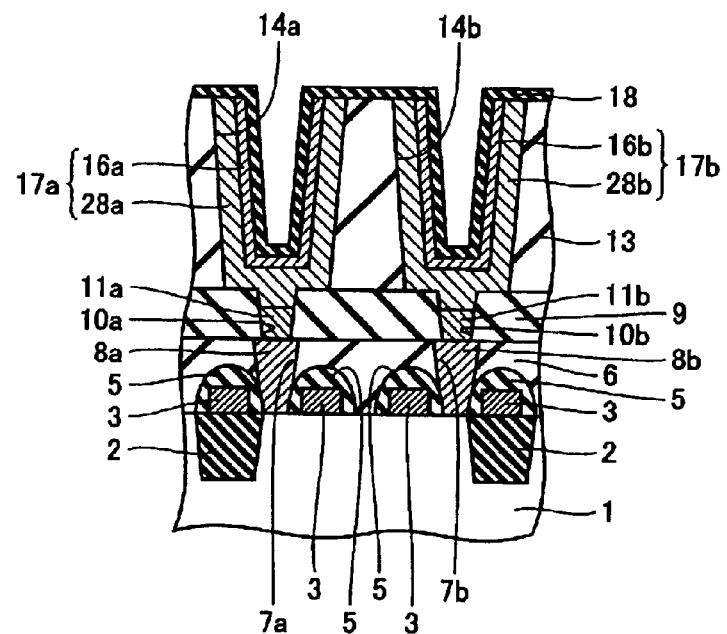

Subsequently, as shown in FIG. 16, capacitor dielectric film 18 is formed to cover SN electrodes 17a, 17b and the upper surface of SN interlayer insulation film 13. For capacitor dielectric film 18, a tantalum oxide film may be used as in the semiconductor device according to the first embodiment of the present invention. Specifically, a tantalum oxide ($Ta_2O_5$) film is first deposited so as to extend over SN electrodes 17a, 17b and to the upper surface of SN interlayer insulation film 13. The tantalum oxide film may have a thickness of e.g. 12 nm. Thereafter, under the processing conditions of an atmospheric temperature of 400° C. and atmospheric gas of ozone (O3) gas, an oxidation process of the tantalum oxide film is performed. As a result, the tantalum oxide film can be crystalized. Accordingly, capacitor dielectric film 18 can be obtained.

Here, second SN electrode films 16a, 16b made of a Ru film that constitute SN electrodes 17a, 17b have good adhesion to first SN electrode films 28a, 28b that are multilayer films made of a TaN/TiN/Ti film. Moreover, the BPTEOS film forming SN interlayer insulation film 13 has good adhesion to first SN electrode films 28a, 28b each formed of the above-described multilayer film. This can prevent a problem such that a gap is produced between SN interlayer insulation film 13 and SN electrodes 17a, 17b as in the conventional example.

In addition, at the oxidation step using ozone gas as described above, oxidation species are blocked by a TaN film included in first SN electrode films 28a, 28b. This can lower the risk of the oxidation species as described above reaching the interface between first SN electrode films 28a, 28b and SC poly plugs 11a, 11b. Thus, oxidation of the interface can be prevented. As a result, occurrence of a problem such as increase of the electric resistance at the interface can be suppressed.

After the step shown in FIG. 16, cell plate electrode 19 (see FIG. 11), contact interlayer insulation film 20 (see FIG. 11), aluminum interconnection 21 (see FIG. 11), and passivation film 22 (see FIG. 11) are formed as in the first embodiment of the present invention, to obtain the semiconductor device as shown in FIG. 11.

Third Embodiment

Figure 17:
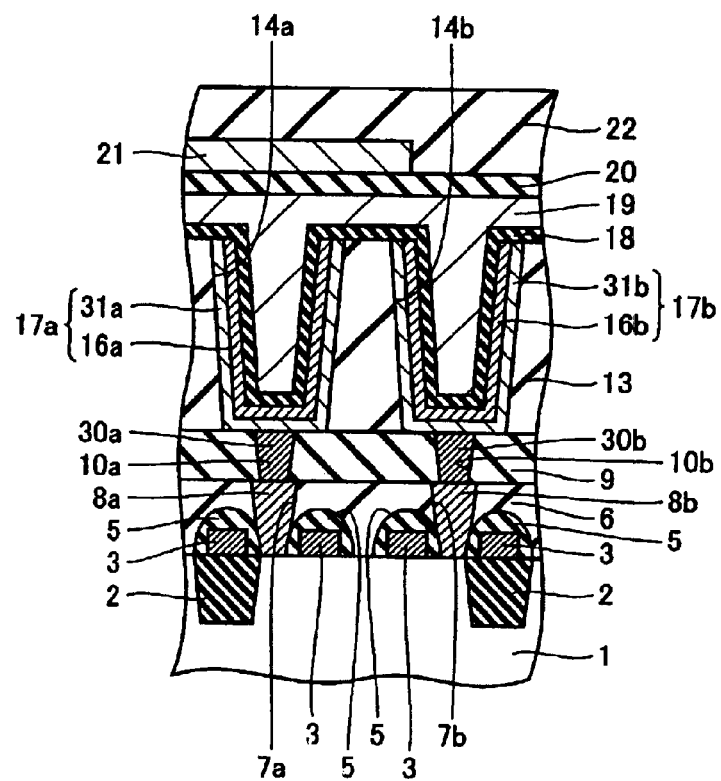
FIG. 17 is a schematic section view showing the third embodiment of the semiconductor device according to the present invention.

Referring to FIG. 17, the third embodiment of the semiconductor device according to the present invention will be described.

Figure 18:
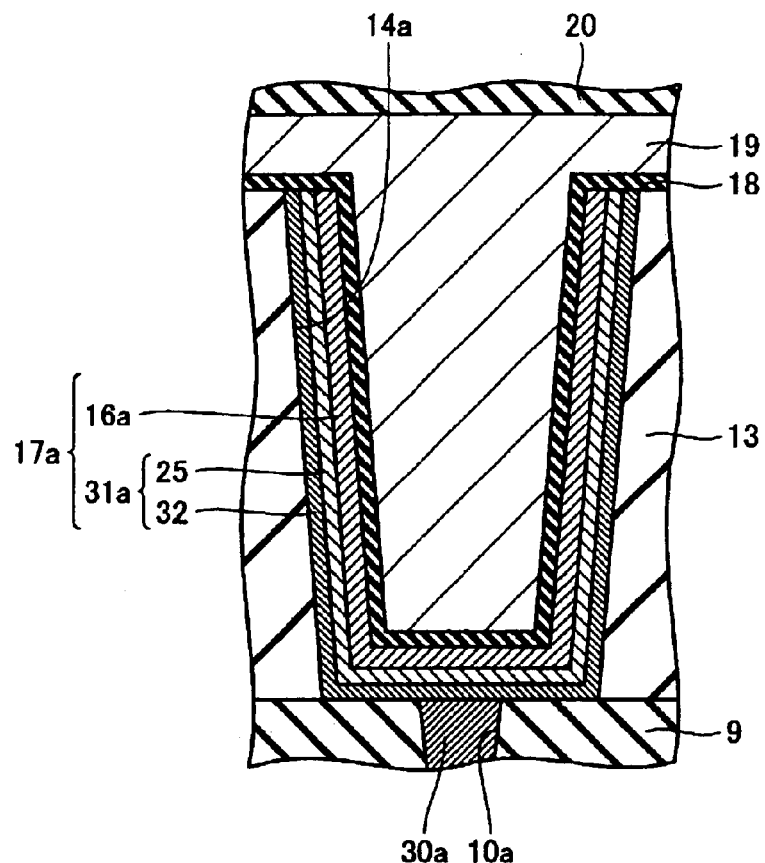
FIG. 18 is an enlarged schematic section view for illustrating the structure of a capacitor in the semiconductor device shown in FIG. 17.

As shown in FIG. 17, this semiconductor device basically has a structure similar to that of the semiconductor device shown in FIG. 1 according to the first embodiment of the present invention, except for a conductive material embedded in through holes 10a, 10b and the structure of first SN electrode films 31a, 31b forming SN electrodes 17a, 17b. Specifically, in the semiconductor device shown in FIG. 17, through holes 10a, 10b are filled with TiN films 30a, 30b serving as conductive plugs that are SC barrier metals. Moreover, each of first SN electrode films 31a, 31b is formed of a multilayer film of a TaN/Ta film which is a film containing tantalum nitride. Here, SN electrodes 17a and 17b basically have similar structures, so that SN electrode 17a is taken as an example for describing a specific structure with reference to FIG. 18. FIG. 18 is an enlarged schematic section view for illustrating the structure of a capacitor in the semiconductor device shown in FIG. 17.

As shown in FIG. 18, a tantalum (Ta) film 32 is so formed as to cover the bottom and side walls of opening 14a. Tantalum nitride (TaN) film 25 is formed on Ta film 32. A multilayer film (TaN/Ta film) of Ta film 32 and TaN film 25 forms first SN electrode film 31a. Second SN electrode film 16a of a Ru film serving as a conductive film is formed on first SN electrode film 31a. First SN electrode film 31a and second SN electrode film 16a constitute SN electrode 17a.

Referring to FIGS. 19 to 23, a manufacturing method for the semiconductor device shown in FIGS. 17 and 18 will be described.

Figure 19:
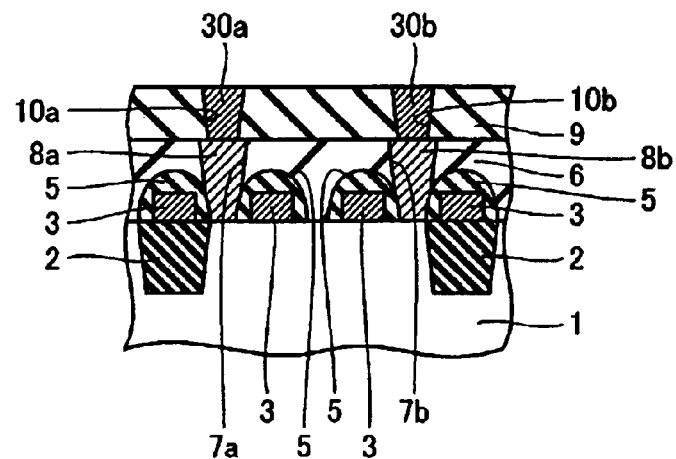
FIGS. 19 to 23 are schematic section views for illustrating the first to the fifth steps of a manufacturing method for the semiconductor device shown in FIGS. 17 and 18.

First, after the step shown in FIG. 3 according to the first embodiment of the present invention is performed, the CVD technique is used to deposit a TiN film so as to extend from the inside of through holes 10a, 10b (see FIG. 19) to the upper surface of second interlayer insulation film 9 (see FIG. 19). The TiN film located on the upper surface of second interlayer insulation film 9 is then removed by the CMP technique. This CMP technique allows TiN films 30a, 30b to be formed as SC barrier metals for filling in through holes 10a, 10b. Accordingly, the structure as shown in FIG. 19 is obtained.

Figure 20:
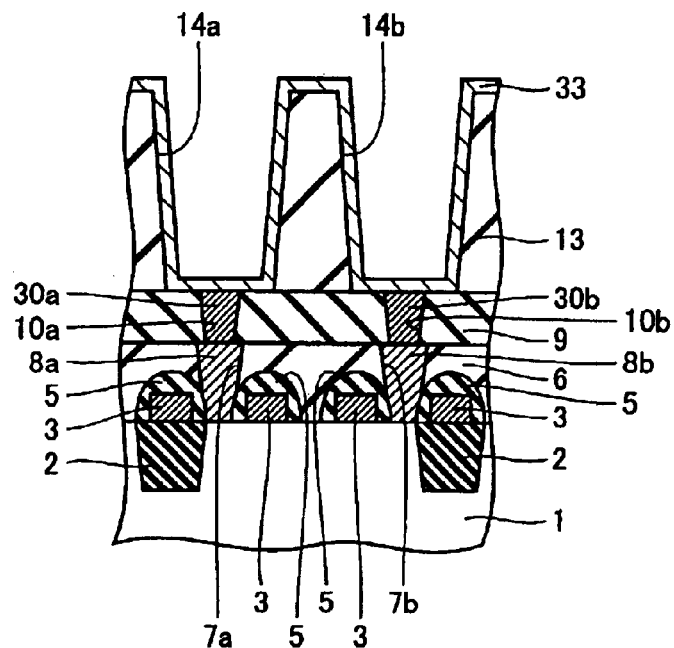

Next, in the step of forming an insulation film, an SN interlayer insulation film 13 (see FIG. 20) is deposited on second interlayer insulation film 9. A BPTEOS film may be used as a material of SN interlayer insulation film 13. SN interlayer insulation film 13 may have a thickness of 1000 nm. A resist film having a pattern is formed on SN interlayer insulation film 13 by the photolithography technique. SN interlayer insulation film 13 is partially removed by anisotropic etching using the resist film as a mask, to form openings 14a, 14b (see FIG. 20) serving as openings for capacitor. Subsequently, the resist film is removed. Then, the step of forming a film including tantalum nitride is performed. Specifically, a Ta film is deposited by the CVD technique so as to extend from the inside of openings 14a, 14b to the upper surface of SN interlayer insulation film 13. A TaN film is deposited on the Ta film by the CVD technique. Thus, a TaN/Ta film 33 (see FIG. 20) which is a multilayer film of the Ta film and the TaN film can be formed. As a result, the structure as shown in FIG. 20 is obtained.

Figure 21:
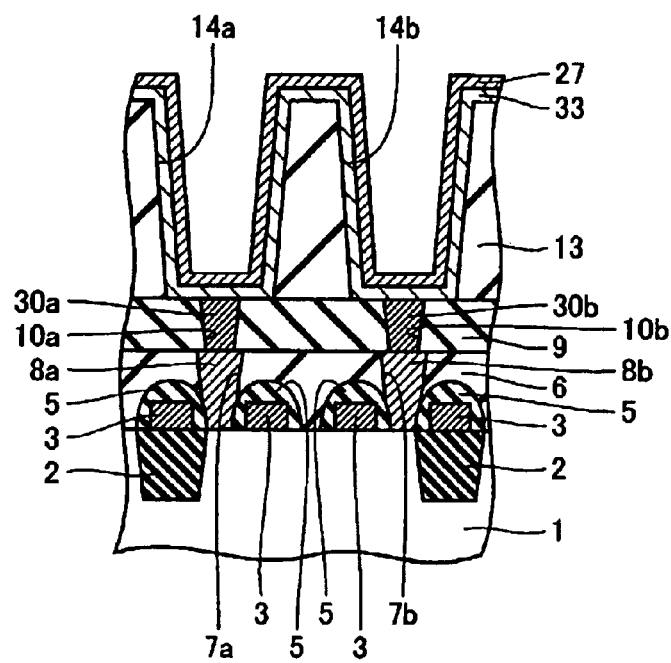

Next, as the step of forming a conductive film, a Ru film having a thickness of 20 nm is deposited on TaN/Ta film 33 by the sputtering technique. Subsequently, a Ru film is further deposited, using the CVD technique, on the Ru film formed by the sputtering technique. Accordingly, Ru film 27 is formed on TaN/Ta film 33, as shown in FIG. 21.

Figure 22:
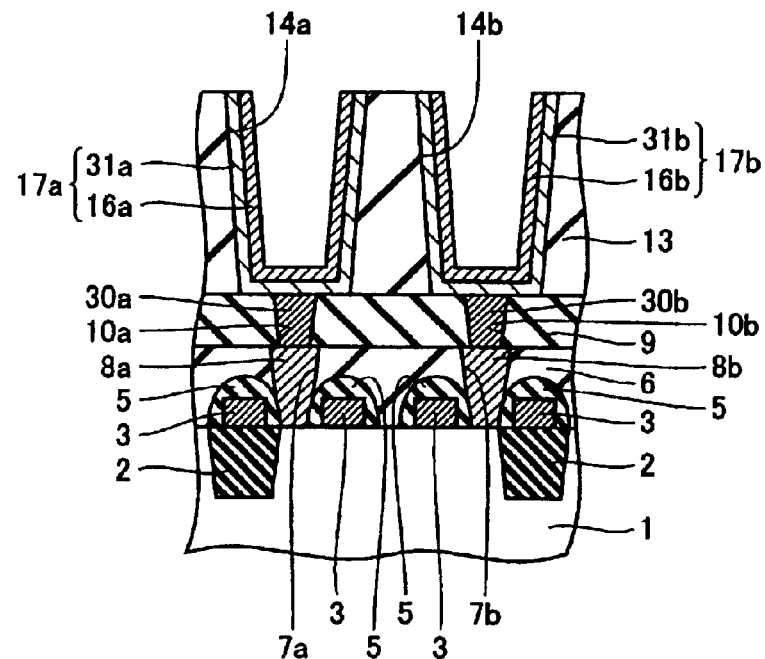

Thereafter, as the step of forming a capacitor lower electrode, the CMP technique is used to partially remove Ru film 27 and TaN/Ta film 33 located on the upper surface of SN interlayer insulation film 13. As a result, the structure as shown in FIG. 22 is obtained. By performing the CMP technique described above, first SN electrode films 31a, 31b made of a TaN/Ta film and second SN electrode films 16a, 16b made of a Ru film can be formed as shown in FIG. 22. First SN electrode films 31a, 31b and second SN electrode films 16a, 16b constitute SN electrodes 17a, 17b.

Figure 23:
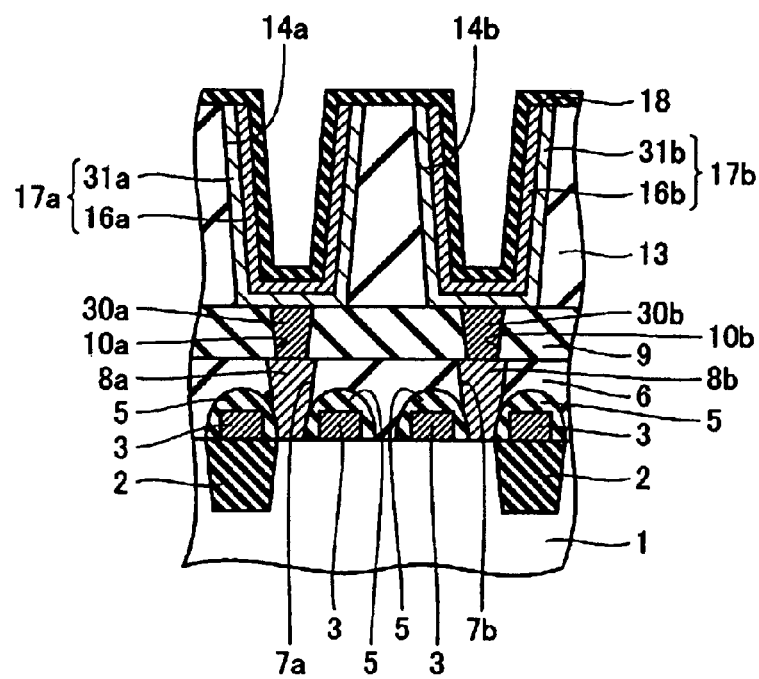

Next, as shown in FIG. 23, capacitor dielectric film 18 is formed so as to extend over SN electrodes 17a, 17b and to the upper surface of SN interlayer insulation film 13. For capacitor dielectric film 18, a tantalum oxide film may be used. Capacitor dielectric film 18 may be formed specifically by the steps below. First, a tantalum oxide film having a thickness of 12 nm is deposited. An oxidation step is performed under the conditions of an atmospheric temperature of 40° C. and atmospheric gas of ozone ($O_3$) gas to crystallize the tantalum oxide film described above. Accordingly, capacitor dielectric film 18 made of a tantalum oxide film can be formed.

Here, second SN electrode films 16a, 16b of a Ru film that constitute SN electrodes 17a, 17b have good adhesion to the TaN/Ta film forming first SN electrode films 31a, 31b. The BPTEOS film forming the SN interlayer insulation film also has good adhesion to the TaN/Ta film forming first SN electrode films 31a, 31b. This can lower the risk of a gap produced between SN interlayer insulation film 13 and SN electrodes 17a, 17b. Moreover, in the oxidation step using ozone gas for forming capacitor dielectric film 18 as described above, oxidation species are blocked by TaN film 25 (see FIG. 18) forming first SN electrode films 31a, 31b, preventing oxidation of the interface between TiN films 30a, 30b serving as SC barrier metals and SN electrodes 17a, 17b. The problem of increase in the electric resistance at the bonding interface between TiN films 30a, 30b and SN electrodes 17a, 17b can be suppressed.

After the step shown in FIG. 23, the step similar to that described with reference to FIG. 10 in the first embodiment of the present invention is performed to form cell plate electrode 19 (see FIG. 17), contact interlayer insulation film (see FIG. 17), aluminum interconnection 21 (see FIG. 17) and passivation film 22 (see FIG. 17). Accordingly, the semiconductor device shown in FIGS. 17 and 18 can be obtained.

First SN electrode films 31a, 31b are thus formed to have a multilayer structure of the TaN/Ta film, so that oxidation of TiN films 30a, 30b serving as SC barrier metals (specifically, oxidation of the bonding interface between TiN films 30a, 30b and poly landing pads 8a, 8b) can be suppressed. This can prevent the storage node contact resistance (SC resistance) from increasing. In addition, by forming first SN electrode films 31a, 31b made of a TaN/Ta film, adhesion between SN interlayer insulation film 13 and SN electrodes 17a, 17b can be improved.

Fourth Embodiment

Figure 24:
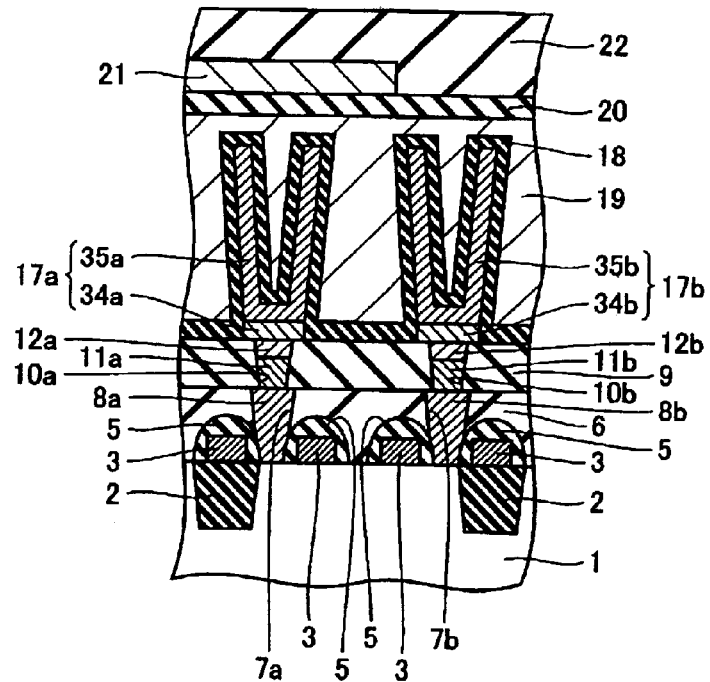
FIG. 24 is a schematic section view showing the fourth embodiment of the semiconductor device according to the present invention.

Referring to FIG. 24, the fourth embodiment of the semiconductor device according to the present invention will be described.

As shown in FIG. 24, this semiconductor device basically has a structure similar to that of the semiconductor device shown in FIG. 1, except for the structure of a capacitor formed by SN electrodes 17a, 17b, capacitor dielectric film 18 and cell plate electrode 19. Specifically, in the semiconductor device shown in FIG. 24, titanium (Ti) films 34a, 34b are arranged on barrier metals 12a, 12b, respectively. Tubular Ru films 35a, 35b are arranged on Ti films 34a, 34b. Ti films 34a, 34b and Ru films 35a, 35b form SN electrodes 17a and 17b, respectively. Ru films 35a, 35b serving as conductive films each has an inner diameter gradually increasing from the bottom portion to the upper portion thereof. It is noted that Ru films 35a, 35b may have any tubular shape with a section of circular, oval, polygon or the like. Further, sidewall portions of Ru films 35a, 35b may each has an approximately straight or curved section. Ti films 34a, 34b and Ru films 35a, 35b form SN electrodes 17a, 17b serving as capacitor lower electrodes.

Capacitor dielectric film 18 is formed to cover the inner circumferential sidewalls, inner circumferential bottom walls and outer circumferential sidewalls of SN electrodes 17a, 17b. Cell plate electrode 19 is formed over capacitor dielectric film 18 such that SN electrodes 17a, 17b and capacitor dielectric film 18 are embedded therein. Thus, capacitor dielectric film 18 and cell plate electrode 19 are arranged over the inner and outer circumferential surfaces of SN electrodes 17a, 17b, to increase the electrostatic capacitance of the capacitor.

Referring to FIGS. 25 to 30, a manufacturing method for the semiconductor device shown in FIG. 24 will be described.

First, the step shown in FIGS. 3 to 6 according to the first embodiment of the present invention are performed. As a result, openings 14a, 14b (see FIG. 26) are formed at SN interlayer insulation film 13 (see FIG. 26). This step corresponds to the step of forming a groove (S10) in FIG. 25.

At step of forming a titanium film, the CVD technique is used to form a titanium (Ti) film 36 (see FIG. 26) so as to extend from the inside of openings 14a, 14b to be the upper surface of SN interlayer insulation film 13. Accordingly, the structure as shown in FIG. 26 is obtained. This step corresponds to the step of forming a Ti film (S20) in FIG. 25.

Figure 25:
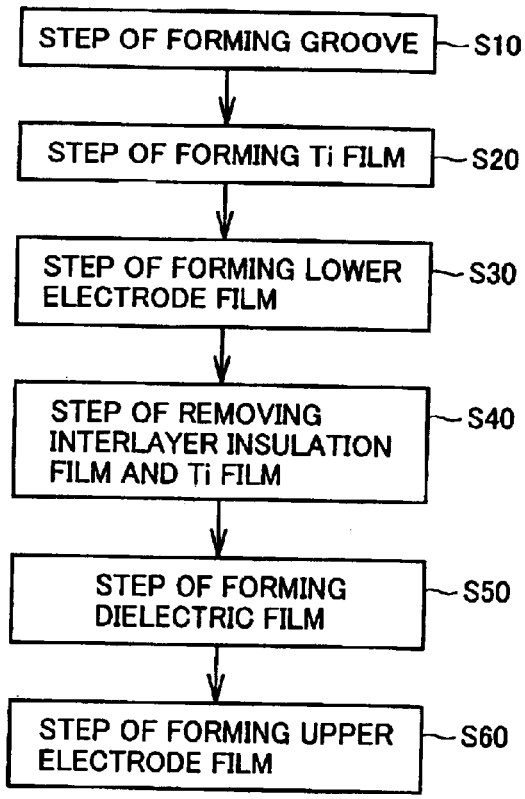
FIG. 25 shows a flow chart for illustrating a manufacturing method for the semiconductor device shown in FIG. 24.
Figure 26:
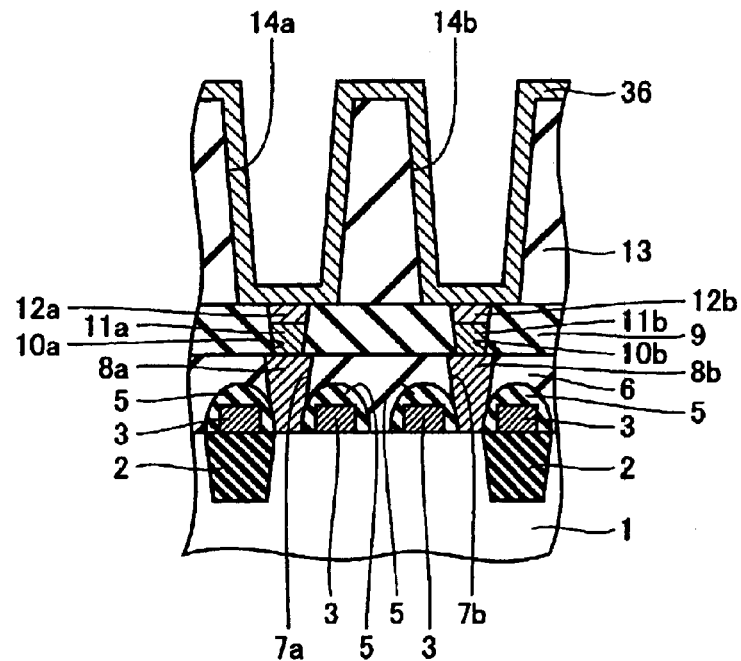
FIGS. 26 to 30 are schematic section views for illustrating the first to the fifth steps of the manufacturing method for the semiconductor device shown in FIG. 24.
Figure 27:
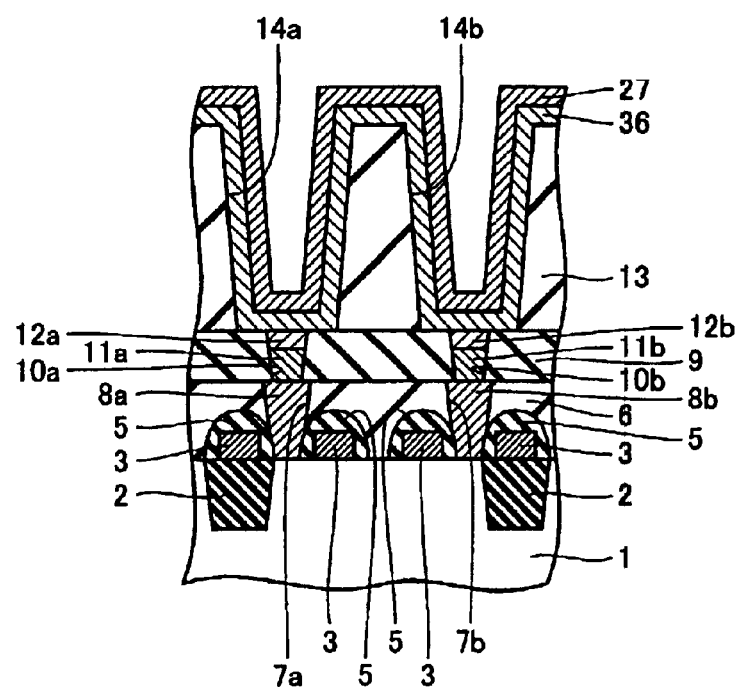
Figure 28:
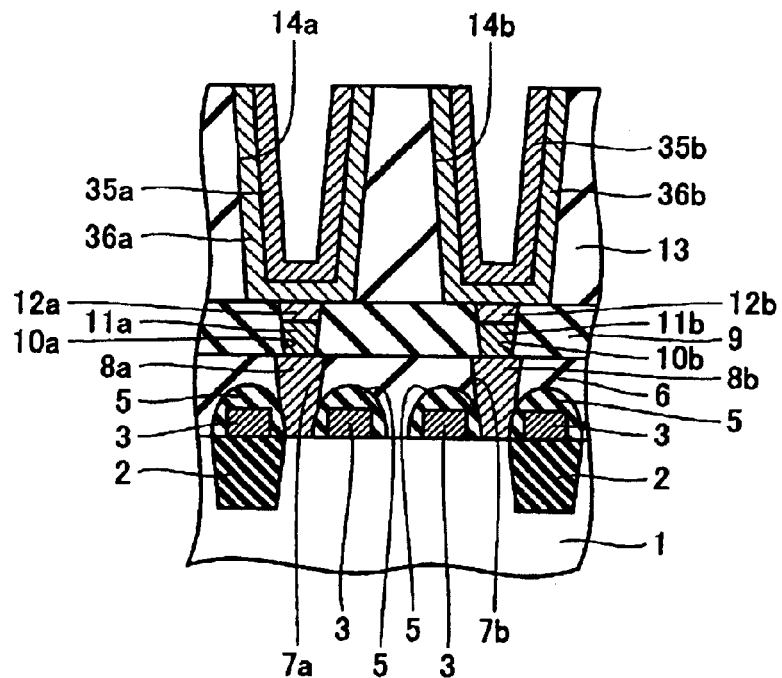

Subsequently, the step of forming a lower electrode film (S30) shown in FIG. 25 is performed. Specifically, as shown in FIG. 27, as the step of forming a conductive film, a Ru film 27 is formed on Ti film 36. Ru film 27 can be formed by a method as described below. First, a Ru film having a thickness of 20 nm is deposited on Ti film 36 by the sputtering technique. Thereafter, an additional Ru film is deposited on the initially deposited Ru film by the CVD technique. As such, the Ru film having a uniform thickness can be deposited on the Ti film. As a result, the structure as shown in FIG. 27 is obtained.

As the step of removing a portion of the titanium film and the conductive film, the CMP technique is used to remove a portion of Ti film 36 and Ru film 27 located on the upper surface of SN interlayer insulation film 13. As a result, a multilayer film formed of Ti films 36a, 36b and Ru films 35a, 35b (a lower electrode film) is deposited within openings 14a, 14b. Thus, the step of forming a lower electrode film (S30) (see FIG. 25) is performed.

Figure 29:
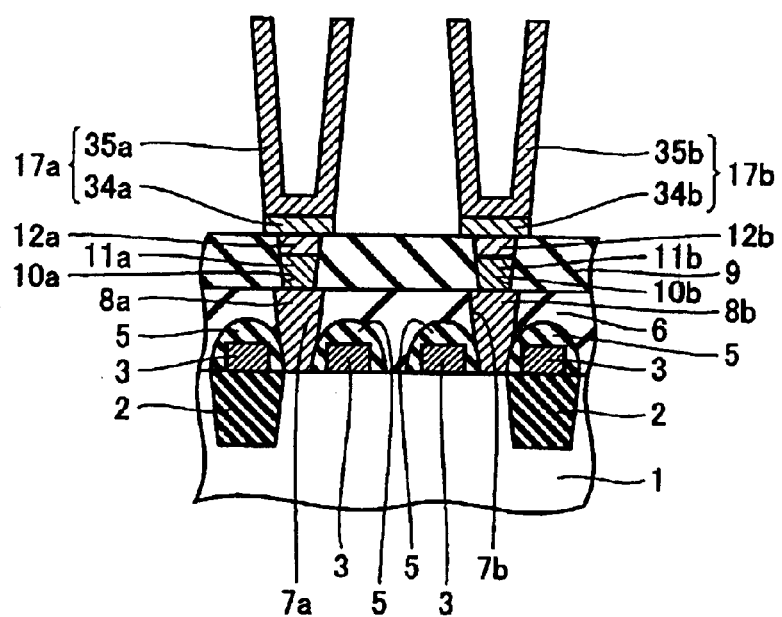

Next, the step of removing the interlayer insulation film and the Ti film (S40) shown in FIG. 25 is performed. Specifically, as the step of forming the capacitor lower electrode, the sidewall portions of Ti films 36a, 36b that abut on SN interlayer insulation film 13 (see FIG. 28) and on the sidewalls of openings 14a, 14b (see FIG. 28) are removed by wet etching using HF liquid as an etchant. As a result, SN electrodes 17a, 17b formed of Ti films 34a, 34b arranged to be connected to barrier metals 12a, 12b and Ru films 35a, 35b arranged on Ti films 34a, 34b and having a cylindrical shape, which is a part of the tubular conductive film, can be obtained as shown in FIG. 29.

It is noted that the portions of Ti films 36a, 36b (see FIG. 28) positioned on the outer circumferential side of the sidewalls of Ru films 35a, 35b are removed here because use of Ti film as SN electrodes 17a, 17b would reduce the capacitance of the capacitor, compared to use of a Ru film as the SN electrodes. In the semiconductor device according to the present invention, a large portion of SN electrodes 17a, 17b is formed by Ru films 35a, 35b as shown in FIG. 29, sufficiently increasing the capacitance of the capacitor. Note that the step of removing a portion of SN interlayer insulation film 13 and Ti films 36a, 36b as described above can also be performed by dry etching.

Figure 30:
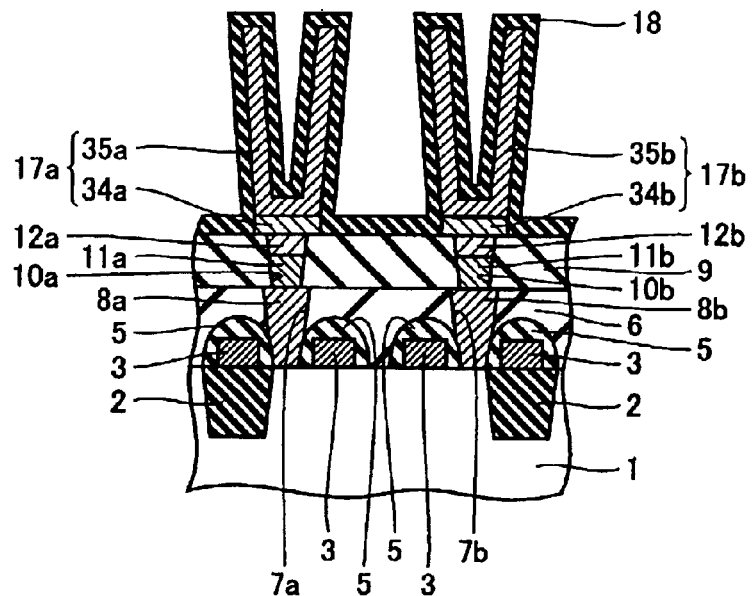

Next, the step of forming a dielectric film (S50) in FIG. 25 is performed. Specifically, as shown in FIG. 30, capacitor dielectric film 18 is so formed as to extend over the inner and outer circumferential surfaces of SN electrodes 17a, 17b and to the upper surface of second interlayer insulation film 9. A tantalum oxide film may be used as capacitor dielectric film 18. Capacitor dielectric film 18 may be formed by the steps described below. First, a tantalum oxide film having a thickness of 12 nm is deposited. Subsequently, an oxidation step is performed under the conditions of a temperature of 40° C. and atmospheric gas of ozone ($O_3$) gas, to crystallize the tantalum oxide film. Accordingly, capacitor dielectric film 18 of a tantalum oxide film can be formed.

It is noted that oxidation species are blocked by the TaN film included in barrier metals 12a, 12b in the oxidation step, preventing oxidation of the interface between SC poly plugs 11a, 11b and barrier metals 12a, 12b.

The step of forming an upper electrode film (S60) shown in FIG. 25 is performed. Specifically, cell plate electrode 19 (see FIG. 24) is formed on capacitor dielectric film 18 by a method similar to the method as described with reference to FIG. 10 in the first embodiment of the present invention. A Ru film may be used as a material of cell plate electrode 19. Subsequently, contact interlayer insulation film 20 (see FIG. 24), aluminum interconnection 21 (see FIG. 24) and passivation film 22 (see FIG. 24) are formed as in the first embodiment of the present invention. Accordingly, the semiconductor device shown in FIG. 24 can be obtained.

As described above, Ti films 36a, 36b (see FIG. 28) are formed as base films of Ru films 35a, 35b (see FIG. 28), preventing SN interlayer insulation film 13 (see FIG. 28) from being separated from Ru films 35a, 35b that are to be SN electrodes 17a, 17b (see FIG. 24) during the manufacturing process of the semiconductor device. This can prevent a shape defect of SN electrodes 17a, 17b (see FIG. 24) due to separation of Ru films 35a, 35b can be prevented.

Further, in the manufacturing method described above, when etching is performed to remove SN interlayer insulation film 13 as shown in FIG. 29, a portion of Ti films 36a, 36b (see FIG. 28) positioned at the outer circumferential side of the sidewalls of Ru films 35a, 35b is also removed, so that both the inner and outer circumferential sides of Ru films 35a, 35b may be utilized as capacitor electrodes. Thus, the electrostatic capacitance of the capacitor can be increased.

The characteristic structure of the semiconductor device according to the present invention illustrated in the embodiments above will be summarized here. The semiconductor device as shown in FIG. 1 according to the first aspect of the present invention is a semiconductor device with a capacitor, including a base insulation film such as second interlayer insulation film 9, a conductive material such as SC poly plugs 11a, 11b, a barrier metal film such as barrier metals 12a, 12b, and a capacitor lower electrode including metal such as SN electrodes 17a, 17b. The base insulation film has an opening such as through holes 10a, 10b. The conductive material is formed within the opening of the base insulation film. The barrier metal film is formed on the conductive material. The capacitor lower electrode is formed on the barrier metal film. The capacitor lower electrode is electrically connected to the conductive material with the barrier metal film interposed therebetween. The barrier metal film is a multilayer film including three layers of a tantalum nitride (Ta) film, a titanium nitride (TiN) film and a titanium (Ti) film.

Accordingly, when an oxidation process is performed to form a capacitor dielectric film on the capacitor lower electrode, oxidation species used in the oxidation process is blocked by the tantalum nitride forming the multilayer film, lowering the risk of the oxidation species reaching the interface region between the conductive film and the multilayer film. This can prevent the interface between the multilayer film (barrier metal film) and the conductive film from being oxidized by the oxidation species. This can prevent a problem of increase in the electric resistance at the interface between the barrier metal film and the conductive film occurring due to oxidation of the interface. Therefore, occurrence of operation failure due to increase of the electric resistance in the semiconductor device can be suppressed.

In the semiconductor device according to the first aspect, the barrier metal film may be a multilayer film in which a titanium film, a titanium nitride film and a tantalum nitride film are layered in order from the conductive material side to the capacitor lower electrode side.

Here, the titanium film and the titanium nitride film are arranged closer to the conductive material than the tantalum nitride film in the barrier metal film. Since the oxidation species are blocked at the tantalum nitride film as described above, the risk of oxidation of the interface between the conductive film and the barrier metal film (interface between the conductive film and titanium film) due to the oxidation species can surely be lowered.

The semiconductor device according to the first aspect may further include an insulation film such as SN interlayer insulation film 13 (see FIG. 1) that allows the capacitor lower electrode to be embedded. In the semiconductor device according to the first aspect, the capacitor lower electrode may include a capacitor lower electrode multilayer film such as first SN electrode films 28a, 28b (arranged to be exposed on the surface of the capacitor lower electrode) (see FIG. 11) that form the surface of the capacitor lower electrode abutting on the insulation film. The capacitor lower electrode multilayer film may have three layers of a tantalum nitride film, a titanium nitride film and a titanium film.

Here, the capacitor lower electrode multilayer film forming the capacitor lower electrode may act as a bonding layer for improving adhesion between the capacitor lower electrode and the insulation film. Specifically, when a BPTEOS film is used as the insulation film, the BPTEOS film has good adhesion to the capacitor lower electrode multilayer film, lowering the risk of separation at the bonding interface between the insulation film and the capacitor lower electrode. As a result, occurrence of a shape defect associated with the separation of the capacitor lower electrode can be suppressed.

In the semiconductor device according to the first aspect, the capacitor lower electrode multilayer film may be made by the same layer as the multilayer film forming the barrier metal film. That is, the capacitor lower electrode multilayer film may also serve as a barrier metal film.

Here, the barrier metal film can be formed concurrently with the capacitor lower electrode multilayer film, so that the manufacturing process for the semiconductor device can be simplified compared to the case where the barrier metal film and the capacitor lower electrode multilayer film are formed at different steps.

A semiconductor device according to the second aspect of the present invention is a semiconductor device with a capacitor, including an insulation film such as SN interlayer insulation film 13 and a capacitor lower electrode including metal such as SN electrodes 17a, 17b, as shown in FIG. 1. The insulation film has an opening for capacitor such as openings 14a, 14b. The capacitor lower electrode is arranged within the opening for capacitor. The capacitor lower electrode has a titanium nitride film such as first SN electrode films 15a, 15b and a conductive film such as second SN electrode films 16a, 16b. The titanium nitride film is arranged to abut on the inner wall of the opening for capacitor. The conductive film is formed on the titanium nitride film and includes metal.

Accordingly, the titanium nitride film may be utilized as a bonding layer between the capacitor lower electrode and the insulation film. In particular, when a BPTEOS film is used as the insulation film, the BPTEOS film has good adhesion to the titanium nitride film, reducing the risk of the capacitor lower electrode being separated from the insulation film. As a result, the possibility of a shape defect occurring due to the separation at the capacitor lower electrode can be lowered.

A semiconductor device according to the third aspect of the present invention is a semiconductor device with a capacitor, including a base insulation film such as second interlayer insulation film 9, a conductive material such as SC poly plugs 11a, 11b, an insulation film such as SN interlayer insulation film 13, and a capacitor lower electrode including metal such as. SN electrodes 17a, 17b, as shown in FIG. 11. The base insulation film has an opening such as through holes 10a, 10b. The conductive material is formed within the opening at the base insulation film. The insulation film is formed on the base insulation film. The base insulation film has an opening for capacitor such as openings 14a, 14b, which exposes the conductive material. The capacitor lower electrode is formed within the opening for capacitor. Further, the capacitor lower electrode is electrically connected with the conductive material. The capacitor lower electrode includes a multilayer film such as first SN electrode films 28a, 28b, which abuts on the conductive material as well as the inner wall of the opening for capacitor. The multilayer film includes three layers of a tantalum nitride film, a titanium nitride film and a titanium film.

Accordingly, when an oxidation process is performed to form a capacitor dielectric film on the capacitor lower electrode, oxidation species used in the oxidation process is blocked by the tantalum nitride forming the multilayer film, lowering the risk of the oxidation species reaching the interface region between the conductive film and the multilayer film. This can prevent oxidation of the interface between the multilayer film and the conductive film forming the capacitor lower electrode by the oxidation species. Thus, the problem of increase in the electric resistance at the interface between the capacitor lower electrode and the conductive film occurring due to oxidation of the interface can be prevented.

Moreover, the multilayer film forming the capacitor lower electrode may act as a bonding layer for improving the adhesion between the capacitor lower electrode and the insulation film. This can lower the risk of separation at the bonding interface between the insulation film and the capacitor lower electrode. As a result, occurrence of a shape defect associated with separation of the capacitor lower electrode can be prevented.

In the semiconductor device according to the third aspect, the multilayer film has a trilaminar structure in which a titanium film, a titanium nitride film and a tantalum nitride film are layered in order from the conductive material side.

Here, the titanium film and the titanium nitride film are arranged closer to the conductive material than the tantalum nitride film in the multilayer film forming the capacitor lower electrode. Since the oxidation species are blocked by the tantalum nitride film as described above, the risk of oxidation of the interface between the conductive film and the capacitor lower electrode (the interface between the conductive film and the titanium film) by the oxidation species can surely be lowered.

A semiconductor device according to the fourth aspect of the present invention is a semiconductor device with a capacitor as shown in FIGS. 17 and 18, including an insulation film such as SN interlayer insulation film 13 and a capacitor lower electrode including metal such as SN electrodes 17a, 17b. The insulation film has an opening for capacitor such as openings 14a, 14b. The capacitor lower electrode is arranged in the opening for capacitor. The capacitor lower electrode has a film containing tantalum nitride such as first SN electrode films 31a, 31b and a conductive film such as second SN electrode films 16a, 16b. The film containing tantalum nitride is arranged to abut on the inner wall of the opening for capacitor. The conductive film is formed on the film containing tantalum nitride and includes metal.

Accordingly, the film containing tantalum nitride that forms the capacitor lower electrode may be utilized as a bonding layer for improving the adhesion between the capacitor lower electrode and the insulation film. This can lower the risk of separation at the bonding interface between the insulation film and the capacitor lower electrode. As a result, occurrence of a shape defect associated with the separation at the capacitor lower electrode can be prevented.

Further, when an oxidation process is performed to form a capacitor dielectric film on the capacitor lower electrode, oxidation species used in the oxidation process is blocked by the film containing tantalum nitride. This can lower the possibility of oxidation by the oxidation species of the bonding interface between the capacitor lower electrode and the conductive plug or the like formed at a layer lower than the capacitor lower electrode and connected to the capacitor lower electrode.

In the semiconductor device according to the fourth aspect, the film containing tantalum nitride may be a multilayer film including tantalum (Ta) film 32 (see FIG. 18) and tantalum nitride (TaN) film 25 (see FIG. 18). The tantalum film may be arranged to abut on the inner wall of the opening for capacitor. The tantalum nitride film may be formed on the tantalum film.

Here, the tantalum film is arranged at the outermost circumferential side of the capacitor lower electrode. This allows the conductive plug to be in contact with the tantalum film at the bonding portion between the capacitor lower electrode and the conductive plug or the like located below the capacitor lower electrode. Accordingly, the electric resistance at the bonding portion between the conductive plug and the capacitor lower electrode can further be reduced compared to the case where the conductive plug is in contact with the tantalum nitride film.

A semiconductor device according to the fifth aspect of the present invention is a semiconductor device with a capacitor, including a capacitor lower electrode including metal such as SN electrodes 17a, 17b (see FIG. 24), capacitor dielectric film 18 (see FIG. 24) and a capacitor upper electrode such as cell plate electrode 19 (see FIG. 24). The capacitor lower electrode is formed on the semiconductor substrate and has a tubular shape. The capacitor dielectric film is so formed as to cover the inner and outer circumferntial surfaces of the capacitor lower electrode. The capacitor upper electrode is formed on the capacitor dielectric film. The capacitor lower electrode includes titanium films 34a, 34b (see FIG. 24) and a conductive film such as Ru films 35a, 35b (see FIG. 24). The conductive film is formed on the titanium film. The conductive film is tubular and includes metal.

Accordingly, both the inner and outer circumferential surfaces of the tubular conductive film forming the capacitor lower electrode may be utilized as the capacitor lower electrode. Thus, the electrostatic capacitance of the capacitor can be increased compared to the case where the capacitor dielectric film is formed only on the inner circumferential surface of the tubular conductive film.

In the semiconductor device according to the second, fourth or fifth aspect above, the conductive film is preferably a ruthenium film.

Here, the electrostatic capacitance of the capacitor can be increased by the use of ruthenium, a material for forming the capacitor lower electrode. Further, a high dielectric film such as a tantalum oxide film is preferably used here as the capacitor dielectric film formed on the capacitor lower electrode. This can ensure increase of the electrostatic capacitance of the capacitor.

A manufacturing method for a semiconductor device according to the sixth aspect of the present invention includes, as in the semiconductor device manufacturing method shown in FIGS. 2 to 10, the steps of preparing a base insulation film having an opening, forming a conductive material within the opening, and forming a multilayer film on the conductive material. The multilayer film includes three layers of a tantalum nitride film, a titanium nitride film and a titanium film. The manufacturing method for the semiconductor device according to the sixth aspect further includes the step of forming a capacitor lower electrode on the multilayer film.

Accordingly, the semiconductor device according to the first aspect can readily be obtained. Moreover, when an oxidation process is performed for forming a capacitor dielectric film made of tantalum oxide or the like on the capacitor lower electrode, oxidation species used in the oxidation process is blocked by the tantalum nitride film of the multilayer film. Thus, oxidation of the bonding interface between the multilayer film and the conductive material by the oxidation species can be prevented.

In the manufacturing method for the semiconductor device according to the sixth aspect, the step of forming the capacitor lower electrode may includes the steps of forming a titanium nitride film on the multilayer film and forming a conductive film including metal on the titanium nitride film.

Here, the titanium nitride film is located at the outermost circumference of the capacitor lower electrode, so that the titanium nitride film may be utilized as a bonding layer between an insulation film and the capacitor lower electrode when the insulation film is so arranged as to enclose the periphery of the capacitor lower electrode. Thus, in the manufacturing process after the step of forming the capacitor lower electrode, the capacitor lower electrode can be prevented from being separated from the insulation film. As a result, occurrence of a shape defect at the capacitor lower electrode can be prevented.

A manufacturing method for a semiconductor device according to the seventh aspect of the present invention includes, as in the semiconductor device manufacturing method shown in FIGS. 6 to 9, the steps of forming an insulation film having an opening for capacitor, forming a titanium nitride film so as to extend from the inside of the opening for capacitor to the upper surface of the insulation film, forming a conductive film including metal on the titanium nitride film, and forming a capacitor lower electrode formed by the titanium nitride film and the conductive film. At the step of forming the capacitor lower electrode, a part of the titanium nitride film and the conductive film located at the upper surface of the insulation film is removed to form the capacitor lower electrode within the opening for capacitor.

Accordingly, the semiconductor device according to the second aspect can readily be obtained. Moreover, the titanium nitride film can be utilized as a bonding layer between the insulation film and the capacitor lower electrode. This can prevent the capacitor lower electrode from being separated from the insulation film at the manufacturing process after the step of forming the capacitor lower electrode.

A manufacturing method for a semiconductor device according to the eighth aspect of the present invention includes, as in the semiconductor device manufacturing method shown in FIGS. 12 to 16, the steps of preparing a base insulation film having an opening, forming a conductive material within the opening, and forming an insulation film arranged on the base insulation film. The insulation film has an opening for capacitor that exposes the conductive material. The manufacturing method for the semiconductor device according to the eighth aspect further includes the step of forming a multilayer film including a titanium film, a titanium nitride film and a tantalum nitride film. The multilayer film is so formed to abut on the conductive material within the opening for capacitor and to extend from the inside of the opening for capacitor to the upper surface of the insulation film. The manufacturing method for the semiconductor device according to the eighth aspect further includes the steps of forming a conductive film including metal on the multilayer film, and forming a capacitor lower electrode formed by the multilayer film and the conductive film within the opening for capacitor by removing a part of the multilayer film and the conductive film located at the upper surface of the insulation film.

Accordingly, the semiconductor device according to the third aspect can readily be obtained. Moreover, the multilayer film serves as a barrier metal film of a conductive material as well as a bonding layer for preventing separation of the capacitor lower electrode from the insulation film. Thus, the manufacturing process can be simplified compared to the case where the barrier metal film and the bonding layer are separately formed.

A manufacturing method for a semiconductor device according to the ninth aspect of the present invention includes, as in the semiconductor device manufacturing method shown in FIGS. 19 to 23, the steps of forming an insulation film having an opening for capacitor, forming a film containing tantalum nitride so as to extend from the inside of the opening for capacitor to the upper surface of the insulation film, forming a conductive film including metal on the film containing tantalum nitride, and forming a capacitor lower electrode. The capacitor lower electrode is formed by the film containing tantalum nitride and the conductive film, and is formed within the opening for capacitor by removing a part of the film containing tantalum nitride and the conductive film located on the upper surface of the insulation film.

Accordingly, the semiconductor device according to the fourth aspect as shown in FIGS. 17 and 18 can readily be obtained.

A manufacturing method for a semiconductor device according to the tenth aspect of the present invention includes, as in the semiconductor device manufacturing method shown in FIGS. 25 and 26, the steps of forming an insulation film having an opening for capacitor, forming a titanium film so as to extend from the inside of the opening for capacitor to the upper surface of the insulation film, forming a conductive film including metal on the titanium film, removing a part of the titanium film and the conductive film located on the upper surface of the insulation film, and forming a capacitor lower electrode. At the step of forming the capacitor lower electrode, a part of the insulation film and the titanium film located on the sidewalls of the opening for capacitor is removed by etching to form the capacitor lower electrode. The capacitor lower electrode is formed by a titanium film portion located on the bottom wall of the opening for capacitor at the titanium film and the conductive film positioned on the titanium film portion. The conductive film positioned on the titanium film portion has a tubular shape along the contour of the opening for capacitor.

As such, the semiconductor device according to the fifth aspect can readily be obtained. Moreover, the titanium film is arranged between the conductive film and the insulation film that are to form the capacitor lower electrode within the opening for capacitor, so that the titanium film can be utilized as a bonding layer between the insulation film and the conductive film at the step of removing a part of the titanium film and the conductive film located on the upper surface of the insulation film and the step of forming the capacitor lower electrode. Accordingly, at the step of removing a part of the titanium film and the conductive film located on the upper surface of the insulation film and the step of forming the capacitor lower electrode, the risk of the conductive film being separated from the insulation film can be lowered. As a result, occurrence of a shape defect in the capacitor lower electrode including the conductive film can be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a capacitor, comprising:

a single base insulation film having an opening;

a conductive material formed within the opening of said single base insulation film;

a barrier metal film formed on said conductive material within the opening of said single base insulation film; and a capacitor lower electrode including metal, formed on said barrier metal film and electrically connected to said conductive material with said barrier metal film interposed therebetween, said barrier metal film being a multilayer film including three layers of a tantalum nitride film, a titanium nitride film and a titanium film.

2. The semiconductor device according to claim 1, wherein said barrier metal film is a multilayer film having a titanium film, a titanium nitride film and a tantalum nitride film layered in order from said conductive material side to said capacitor lower electrode side.

3. The semiconductor device according to claim 1, comprising an insulation film allowing said capacitor lower electrode to be embedded in the insulation film, said capacitor lower electrode including a capacitor lower electrode multilayer film forming a surface of said capacitor lower electrode abutting on said insulation film, said capacitor lower electrode multilayer film has three layers of a tantalum nitride film, a titanium nitride film and a titanium film.

4. A semiconductor device including a capacitor, comprising:

a base insulation film having an opening; a conductive material formed within the opening of said base insulation film;

an insulation film formed on said base insulation film and having the opening for the capacitor that exposes said conductive material; and a capacitor lower electrode including metal, formed within said opening for the capacitor and electrically connected with said conductive material, said capacitor lower electrode including a multilayer film abutting on said conductive material as well as an inner wall of said opening for capacitor, said multilayer film including three layers of a tantalum nitride film, a titanium nitride film and a titanium film.

5. The semiconductor device according to claim 4, wherein said multilayer film includes a titanium film, a titanium nitride film and a tantalum nitride film layered in order from said conductive material side.

6. The semiconductor device according to claim 2, wherein:

the barrier metal film is located within the opening in the base insulation film;

the capacitor lower electrode is located within a different opening formed in an insulation film overlying the base insulation film; and the capacitor lower electrode is fonned of a dual layered film of a titanium nitride film and a ruthenium film.

7. The semiconductor device according to claim 5, wherein said multilayer film partially extends into the opening in which the conductive material is located.

* * * * *